US008319260B2

(12) United States Patent
Lee et al.

(10) Patent No.: US 8,319,260 B2
(45) Date of Patent: Nov. 27, 2012

(54) SEMICONDUCTOR DEVICES HAVING POLYSILICON GATE LAYER PATTERNS AND METHODS OF MANUFACTURING THE SAME

(75) Inventors: Deok-Hyung Lee, Seoul (KR); Soo-Jin Hong, Guri-si (KR); Seong-Hoon Jeong, Masan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 89 days.

(21) Appl. No.: 12/805,400

(22) Filed: Jul. 29, 2010

(65) Prior Publication Data

US 2011/0079857 A1 Apr. 7, 2011

(30) Foreign Application Priority Data

Oct. 1, 2009 (KR) .................... 10-2009-0093902

(51) Int. Cl.
*H01L 21/336* (2006.01)

(52) U.S. Cl. ......... 257/288; 257/E27.062; 257/E21.632; 438/197

(58) Field of Classification Search .................. 257/369, 257/E27.062, E21.632, 211, 213, 288; 438/142, 438/197, 514
See application file for complete search history.

(56) References Cited

U.S. PATENT DOCUMENTS 5,189,504 A * 2/1993 Nakayama et al. ......... 257/422
6,891,192 B2 * 5/2005 Chen et al. ................... 257/49
7,303,949 B2 12/2007 Chen et al.
7,504,693 B2 3/2009 Zhu et al.
2009/0149010 A1 6/2009 Zhu et al.

OTHER PUBLICATIONS

Bourdon et al., "Poly-Si gate engineering for advanced CMOS transistors by germanium implantation", 2005, Nuclear Instruments and Methods in Physics Research, vol. B237, pp. 148-154.*

* cited by examiner

*Primary Examiner* — A. Sefer
*Assistant Examiner* — Nikolay Yushin
(74) *Attorney, Agent, or Firm* — Harness, Dickey & Pierce, P.L.C.

(57) ABSTRACT

In semiconductor devices, methods of forming the same, the semiconductor device include a first gate structure having a first gate oxide layer pattern, a first polysilicon layer pattern containing atoms larger than silicon and a first hard mask layer pattern on substrates under tensile stress. N-type impurity regions are formed under the surface of the substrate on both sides of the first gate structure. A second gate structure having a second gate oxide layer pattern, a second polysilicon layer pattern containing atoms smaller than silicon and a second hard mask layer pattern on substrates under compressive stress. Additionally, P-type impurity regions are formed under the surface of the substrate on both sides of the second gate structure. The semiconductor devices have good device properties.

10 Claims, 17 Drawing Sheets

SEMICONDUCTOR DEVICES HAVING POLYSILICON GATE LAYER PATTERNS AND METHODS OF MANUFACTURING THE SAME

CLAIM OF PRIORITY

This application claims priority under 35 USC §119 to Korean Patent Application No. 10-2009-0093902, filed on Oct. 1, 2009 in the Korean Intellectual Property Office (KIPO), the contents of which are herein incorporated by reference in their entirety.

BACKGROUND

1. Field

Example embodiments relate to semiconductor devices, and methods of manufacturing the semiconductor devices. More particularly, example embodiments relate to semiconductor devices including a complementary metal-oxide-semiconductor (CMOS) transistor having improved operation characteristics, and methods of manufacturing the semiconductor devices including the CMOS transistor having improved operation characteristics.

2. Description of the Related Art

A memory circuit or a logic circuit may include a metal-oxide-semiconductor field effect transistor (MOSFET, hereinafter referred to as a transistor) serving as a unit device. A transistor that has a high speed operation at a low-voltage and is small and highly integrated has been developed.

Recently, in order to form a transistor having a high speed operation, methods of forming a channel region of the transistor at a silicon substrate under tensile or compressive stress have been introduced. For example, a stress memorization technique (SMT) method in which a silicon nitride layer is formed on a substrate and a heat treatment is performed on the substrate is being used to change the stress of a channel region. However, when the SMT method is used, depositing a metal layer pattern or a hard mask on a polysilicon layer pattern serving as a gate electrode that is formed on the silicon nitride layer is difficult. Thus, the SMT method may not be applicable to various memory devices such as a dynamic random access memory (DRAM) device.

SUMMARY

Example embodiments provide semiconductor devices including CMOS transistors having good characteristics.

Example embodiments provide methods of manufacturing the semiconductor devices including the CMOS transistors having good characteristics.

According to example embodiments, there is provided a semiconductor device. The semiconductor device may include a first gate structure, n-type impurity regions, a second gate structure and p-type impurity regions. The first gate structure may include a first gate insulation layer pattern, a first polysilicon layer pattern and a first hard mask sequentially stacked on a substrate in a first region thereof, the first polysilicon layer pattern having atoms larger than silicon. The n-type impurity regions may be formed at first upper portions of the substrate adjacent to the first gate structure. The second gate structure may include a second gate insulation layer pattern, a second polysilicon layer pattern and a second hard mask on the substrate in a second region thereof, the second polysilicon layer pattern having atoms smaller than silicon. The p-type impurity regions at second upper portions of the substrate on adjacent to the second gate structure.

In example embodiments, the substrate in the first region may be under tensile stress and the substrate in the second region may be under compress stress.

In example embodiments, the semiconductor device may include a first conductive layer pattern and a second conducive layer pattern. The first conductive layer pattern may include a metal and may be between the first polysilicon layer pattern and the first hard mask. The second conductive layer pattern may include a metal and may be between the second polysilicon layer pattern and the second hard mask.

In example embodiments, the first polysilicon layer pattern may include germanium, and the second polysilicon layer pattern may include carbon.

According to example embodiments, there is provided a method of manufacturing a semiconductor device. In the method, a gate insulation layer may be formed on a substrate including a first region and a second region. A first polysilicon layer and a second polysilicon layer may be formed on the gate insulation layer, the first polysilicon layer including atoms larger than silicon and being on a first portion of the gate insulation layer in the first region, and the second polysilicon layer including atoms smaller than silicon and being on a second portion of the gate insulation layer in the second region. A first hard mask and a second hard mask may be formed on the first and second polysilicon layers, respectively. The first and second polysilicon layers and the first and second portions of the gate insulation layer may be patterned to form first and second gate electrodes and first and second gate insulation layer patterns, respectively. N-type impurity regions may be formed by implanting n-type impurities at first upper portions of the substrate adjacent to the first gate electrode. P-type impurity regions may be formed by implanting p-type impurities at second upper portions of the substrate adjacent to the second gate electrode.

In example embodiments, the first polysilicon layer pattern may include germanium, and the second polysilicon layer pattern may include carbon.

In example embodiments, the first polysilicon layer pattern may include germanium in a range of about 1% to about 30% by atomic percent.

In example embodiments, the second polysilicon layer pattern may include carbon in a range of about 0.1% to about 5% by atomic percent.

In example embodiments, a conductive layer including a metal may be formed on the first and second polysilicon layers.

In example embodiments, an amorphous silicon layer may be formed on the gate insulation layer. Atoms having a larger size than that of silicon may be implanted into a first portion of the amorphous silicon layer in the first region. Atoms having a smaller size than that of silicon may be implanted into a second portion of the amorphous silicon layer in the second region. The amorphous silicon layer may be crystallized by a heat treatment process thereon to form the first and second polysilicon layers.

In example embodiments, n-type impurities and p-type impurities may be doped into the first and second portions of the amorphous silicon layer, respectively.

According to example embodiments, polysilicon layers on or over a substrate, which may serve as gate electrodes of an NMOS transistor and a PMOS transistor, may include different elements for loading different stress on channel regions of the NMOS and PMOS transistors, respectively. Accordingly, the mobility of carriers of the transistors may be increased, and thus a semiconductor device including the NMOS and PMOS transistors may have improved operation characteristics.

Additionally, the gate electrodes of the n-type and p-type transistors may further include a conductive pattern having a metal and a hard mask. Accordingly, the semiconductor device in accordance with example embodiments may be used for various memory devices having a dynamic random access memory (DRAM).

BRIEF DESCRIPTION OF THE DRAWINGS

Example embodiments will be more clearly understood from the following detailed description taken in conjunction with the accompanying drawings.

FIG. 1 is a cross-sectional view illustrating a CMOS transistor in accordance with example embodiments;

FIGS. 2 to 9 are cross-sectional views illustrating a method of manufacturing a CMOS transistor in FIG. 1;

FIG. 10 is a cross-sectional view illustrating a method of manufacturing a CMOS transistor in accordance with example embodiments;

FIG. 11 is a cross-sectional view illustrating a CMOS transistor in accordance with example embodiments;

FIGS. 12 to 15 are cross-sectional views illustrating a method of manufacturing a CMOS transistor in FIG. 11;

FIGS. 16 to 19 are cross-sectional views illustrating a method of manufacturing a CMOS transistor in accordance with example embodiments;

FIG. 20 is a cross-sectional view illustrating a DRAM device in accordance with example embodiments;

FIGS. 21 to 24 are cross-sectional views illustrating a method of manufacturing a DRAM device in FIG. 20;

FIG. 25 is a cross-sectional view illustrating a NAND flash memory device in accordance with example embodiments;

FIGS. 26 to 30 are cross-sectional views illustrating a method of manufacturing a NAND flash memory device, in FIG. 25;

FIG. 31 is a graph showing transconductances (Gm) of Examples 1 and 2 and Comparative Example; and FIG. 32 is a block diagram illustrating a computer system including a gate structure in accordance with example embodiments.

DETAILED DESCRIPTION OF THE EMBODIMENTS

Figure 1:
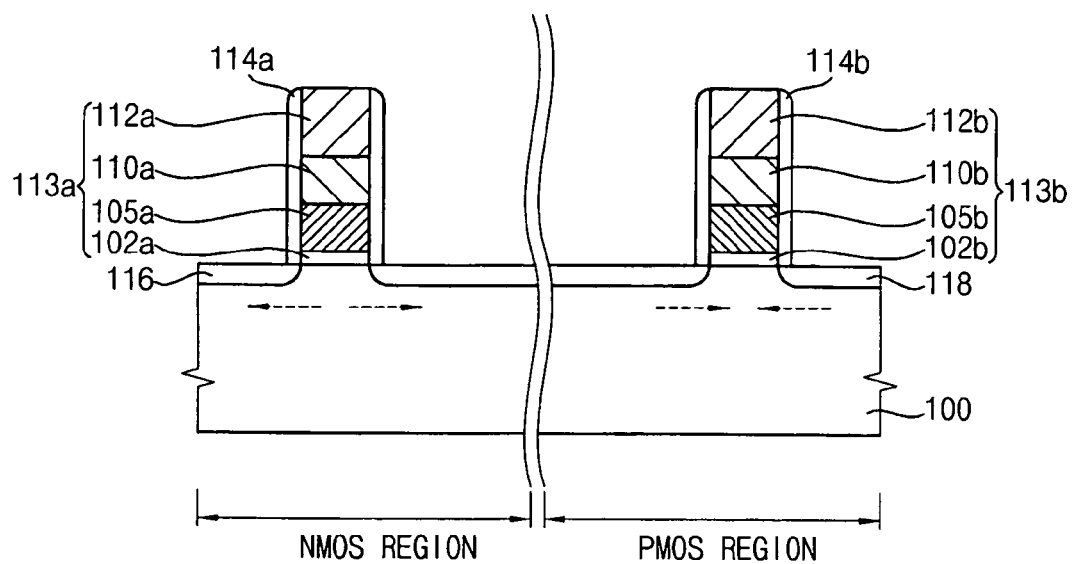
FIGS. 1 to 32 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, however do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a CMOS transistor in accordance with example embodiments.

Referring to FIG. 1, a substrate 100 including a semiconductor material may be provided. For example, the substrate 100 may include single crystalline silicon.

The substrate 100 may be divided into a region in which a negative channel metal-oxide-semiconductor (NMOS) transistor may be formed (hereinafter, referred to as an NMOS region), and a region in which a positive channel metal-oxide-semiconductor (PMOS) transistor may be formed (hereinafter, referred to as a PMOS region). Additionally, the substrate 100 may be divided into an active region and a field region.

The CMOS transistor may include an NMOS transistor and a PMOS transistor in the NMOS region and the PMOS region, respectively.

The NMOS transistor may include a first gate structure 113a and first impurity regions 116. The first gate structure 113a may be formed on the substrate 100 in the NMOS region. The first impurity regions 116 may be formed at upper portions of the substrate 100 adjacent to the first gate structure 113a. A first channel region of the NMOS transistor may be formed at an upper portion of the substrate 100 between the first impurity regions 116. Additionally, the NMOS transistor may include first gate spacers 114a on sidewalls of the first gate structure 113a.

The first gate structure 113a may include a first gate insulation layer pattern 102a, a first polysilicon layer pattern 105a, a first conductive layer pattern 110a and a first hard mask 112a sequentially stacked on the substrate 100 in the NMOS region.

The first gate insulation layer pattern 102a may include a silicon oxide.

The first polysilicon layer pattern 105a may include n-type impurities. The first polysilicon layer pattern 105a may have a proper work function for serving as a gate electrode of the NMOS transistor because of the n-type impurities.

The first polysilicon layer pattern 105a may include atoms having a larger size than that of silicon. The atoms having the larger size than that of silicon may increase the lattice parameter of polysilicon. The first polysilicon layer pattern 105a may include any atoms that may be easily combined with silicon and substantially increase the polysilicon lattice parameter.

In example embodiments, the first polysilicon layer pattern 105a may include germanium (Ge). When the first polysilicon layer pattern 105a includes less than about 1% germanium by atomic percent, increasing the polysilicon lattice parameter may be difficult. When the first polysilicon layer pattern 105a includes more than about 30% germanium by atomic percent, the number of uncombined germanium atoms with silicon atoms may undesirably increase. Therefore, the first polysilicon layer pattern 105a may include germanium in a range of about 1% to about 30% by atomic percent. Germanium may increase the polysilicon lattice parameter of the first polysilicon layer pattern 105a.

Alternatively, the first polysilicon layer pattern 105a may include another element increasing the polysilicon lattice parameter. In example embodiments, the first polysilicon layer pattern 105a may include phosphorus or arsenic in addition to or instead of germanium. In this case, phosphorus or arsenic may be doped highly, thereby to not only control the work function of the first polysilicon layer pattern 105a, but also increase the polysilicon lattice parameter of the first polysilicon layer pattern 105a.

The first conductive layer pattern 110a may include a metal. Examples of the first conductive layer pattern 110a may include tungsten, tungsten silicide, etc. These may be used alone or in a combination thereof. The first conductive layer pattern 110a may reduce the resistance of the gate structure 113a.

The first hard mask 112a may include a silicon nitride.

The first gate spacers 114a may include a silicon nitride. Offset spacers (not shown) may be further formed between the first gate spacers 114a and the first gate structure 113a.

The first impurity regions 116 serving as source/drain regions may be doped with n-type impurities. In example embodiments, the first impurity regions 116 may have a lightly doped drain (LDD) structure including a lightly doped region and a heavily doped region.

As described above, the NMOS transistor may have the first polysilicon layer pattern 105a including the atoms increasing the polysilicon lattice parameter thereof. Thus, the first channel region under the first polysilicon layer pattern 105a in the NMOS region may be under tensile stress, so that the mobility of electrons serving as a carrier may be increased. As a result, the NMOS transistor may have improved ON current and operation characteristics.

The PMOS transistor may include a second gate structure 113b and second impurity regions 118. The second gate structure 113b may be formed on the substrate 100 in the PMOS region. The second impurity regions 118 may be formed at upper portions of the substrate 100 adjacent to the second gate structure 113b. A second channel region of the PMOS transistor may be formed at an upper portion of the substrate 100 between the second impurity regions 118. Additionally, the PMOS transistor may include second gate spacers 114b on sidewalls of the second gate structure 113b.

The second gate structure 113b may include a second gate insulation layer pattern 102b, a second polysilicon layer pattern 105b, a second conductive layer pattern 110b and a second hard mask 112b sequentially stacked on the substrate 100 in the PMOS region.

The second gate insulation layer pattern 102b may include a silicon oxide.

The second polysilicon layer pattern 105b may include p-type impurities. The second polysilicon layer pattern 105b may have a proper work function for serving as a gate electrode of the PMOS transistor because of the p-type impurities.

The second polysilicon layer pattern 105b may include atoms having a smaller size than that of silicon. The atoms having the smaller size than that of silicon may decrease the lattice parameter of polysilicon. The second polysilicon layer pattern 105b may include any atoms that may be easily combined with silicon and substantially decrease the polysilicon lattice parameter.

In example embodiments, the second polysilicon layer pattern 105b may include carbon (C). When the second polysilicon layer pattern 105b includes less than about 1% carbon by atomic percent, decreasing the polysilicon lattice parameter may be difficult. When the second polysilicon layer pattern 105b includes more than about 5% carbon by atomic percent, the number of uncombined carbon atoms with silicon atoms may undesirably increase. Therefore, the second polysilicon layer pattern 105b may include carbon in a range of about 1% to about 5% by atomic percent. Carbon may increase the polysilicon lattice parameter of the second polysilicon layer pattern 105b.

Alternatively, the second polysilicon layer pattern 105b may include another element decreasing the polysilicon lattice parameters. In example embodiments, the second polysilicon layer pattern 105b may include nitrogen or oxygen in addition to or instead of carbon.

The second conductive layer pattern 110b may include a metal. Examples of the second conductive layer pattern 110b may include tungsten, tungsten silicide, etc. These may be used alone or in a combination thereof. The second conductive layer pattern 110b may reduce the resistance of the gate structure 113b.

The second hard mask 112b may include a material substantially the same as that of the first hard mask 112a. Particularly, the second hard mask 112b may include a silicon nitride.

The second gate spacers 114b may include a silicon nitride. Offset spacers (not shown) may be further formed between the second gate spacers 114b and the second gate structure 113b.

The second impurity regions 118 serving as source/drain regions may be doped with p-type impurities. In example embodiments, the second impurity regions 118 may have a lightly doped drain (LDD) structure including a lightly doped region and a heavily doped region.

As described above, the PMOS transistor may have the second polysilicon layer pattern 105b including the atoms increasing the polysilicon lattice parameter thereof. Thus, the second channel region under the second polysilicon layer pattern 105b in the PMOS region may be under compressive stress, so that the mobility of holes serving as a carrier may be increased. As a result, the PMOS transistor may have improved operation characteristics.

As described above, the first channel region in the NMOS region and the second channel region in the PMOS region may have different stress respectively so that the mobility of the carrier of each transistor may be increased. As a result, the NMOS and PMOS transistor may have improved operation characteristics.

FIGS. 2 to 9 are cross-sectional views illustrating a method of manufacturing the CMOS transistor in FIG. 1 in accordance with example embodiments.

Figure 2:
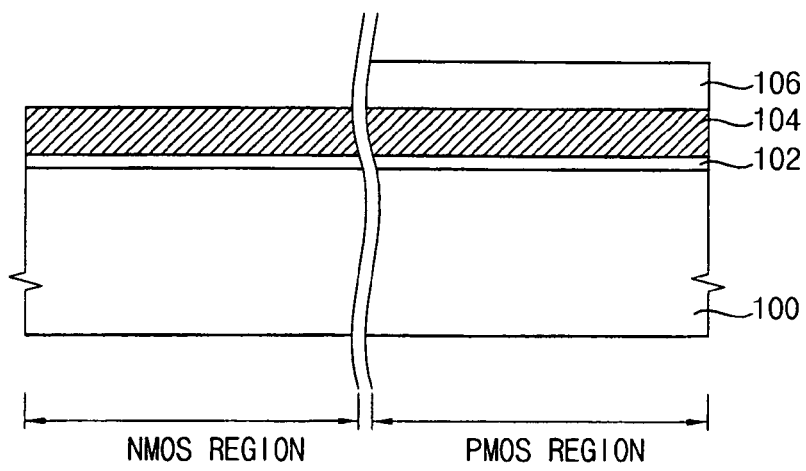

Referring to FIG. 2, a substrate 100 including a semiconductor material, e.g., single crystalline silicon may be provided. The substrate 100 may be divided into an NMOS region and a PMOS region. A gate insulation layer 102 may be formed on the substrate 100 using a silicon oxide. In example embodiments, the gate insulation layer 102 may be formed by oxidizing a top surface of the substrate 100.

An amorphous silicon layer 104 that is not doped with impurities may be formed on the gate insulation layer 102.

The amorphous silicon layer 104 may be formed by a chemical vapor deposition (CVD) process using a reaction gas including silicon precursor. If the CVD process is performed at a temperature of more than about 600° C., a crystalline silicon layer may be formed. Therefore, the amorphous silicon layer 104 may be formed at a temperature of less than about 600° C. Examples of the reaction gas may include dichlorosilane (DCS, $SiCl_2H_2$), silane ($SiH_4$), disilane ($Si_2H_6$), etc.

A first photoresist film may be coated on the amorphous silicon layer 104, and the first photoresist film may be patterned to form a first photoresist pattern 106. The first photoresist pattern 106 may expose a first portion of the amorphous silicon layer 104 in the NMOS region, and cover a second portion of the amorphous silicon layer 104 in the PMOS region.

Figure 3:
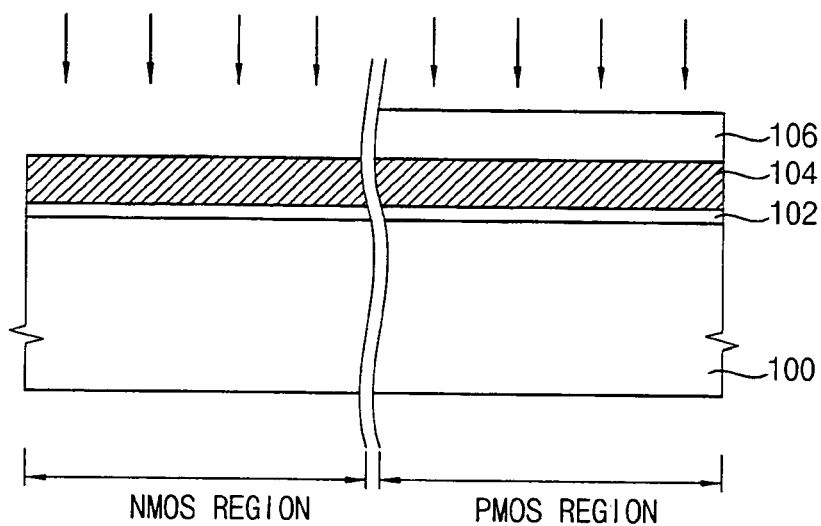

Referring to FIG. 3, atoms having a larger size than that of silicon may be implanted into the exposed first portion of the amorphous silicon layer 104 by a first ion implantation process using the first photoresist pattern 106 as an ion implantation mask. In example embodiments, the atoms may be implanted into the first portion of the amorphous silicon layer 104 not to contact the gate insulation layer 102.

In an example embodiment, germanium ions may be implanted into the first portion of the amorphous silicon layer 104. An amount of the germanium ions implanted into the amorphous silicon layer 104 may be in a range of about 1% to about 30% by atomic percent.

The first ion implantation process may include a beam line process, a cluster process, a plasma doping process, etc.

Figure 4:
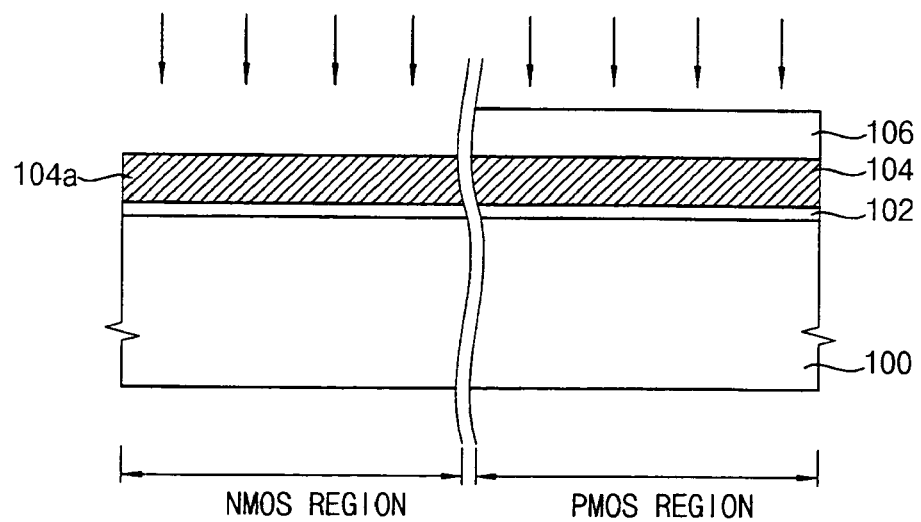

Referring to FIG. 4, n-type impurities may be implanted into the first portion of the amorphous silicon layer 104 by a second ion implantation process using the first photoresist pattern 106 as an ion implantation mask, so that a first amorphous silicon layer 104a having a desired work function may be formed. For example, the n-type impurities may include arsenic, phosphorus, etc.

In an example embodiment, the n-type impurities may be implanted at an amount larger than that required to control the work function of the first amorphous silicon layer 104a, so that the excessive portion thereof may increase the lattice parameter of the first amorphous silicon layer 104a. Even when the n-type impurities are implanted into the first amorphous silicon layer 104a too much, the work function of the first amorphous silicon layer 104a may not decrease unceasingly, and thus the lattice parameter of the first amorphous silicon layer 104a may be controlled by changing the amount of the n-type impurities.

The first photoresist pattern 106 may be removed by an ashing process and/or a stripping process.

In an example embodiment, the order of the first and second ion implantation processes may be switched, i.e., the second ion implantation process may be performed before the first ion implantation process. Additionally, the first and second ion implantation processes may be performed in situ.

Figure 5:
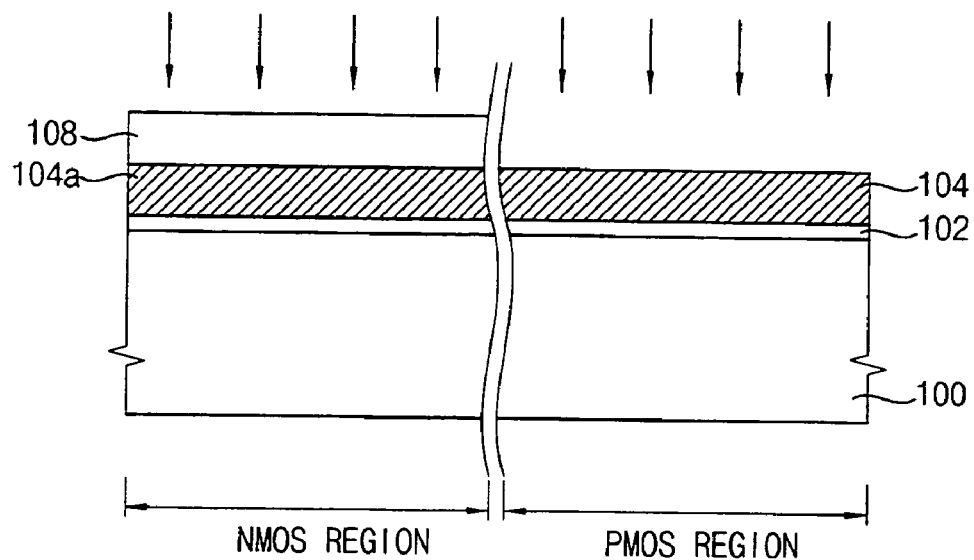

Referring to FIG. 5, the first amorphous silicon layer 104a and the amorphous silicon layer 104 may be coated with a second photoresist film, and the second photoresist film may be patterned to form a second photoresist pattern 108. The second photoresist pattern 108 may expose the second portion of the amorphous silicon layer 104 in the PMOS region and cover the first amorphous silicon layer 104a in the NMOS region.

Atoms having a smaller size than that of silicon may be implanted into the exposed second portion of the amorphous silicon layer 104 by a third ion implantation process using the second photoresist pattern 108 as an ion implantation mask. In example embodiments, the atoms may be implanted into the second portion of the amorphous silicon layer 104 not to contact the gate insulation layer 102.

In an example embodiment, carbon ions may be implanted into the second portion of the amorphous silicon layer 104. An amount of carbon ions implanted into the second portion of the amorphous silicon layer 104 may be in a range of about 1% to about 5% by atomic percent.

Alternatively, nitrogen ions or oxygen ions may be implanted in addition to or instead of the carbon ions.

The third ion implantation process may include a beam line process, a cluster process, a plasma doping process, etc.

Figure 6:
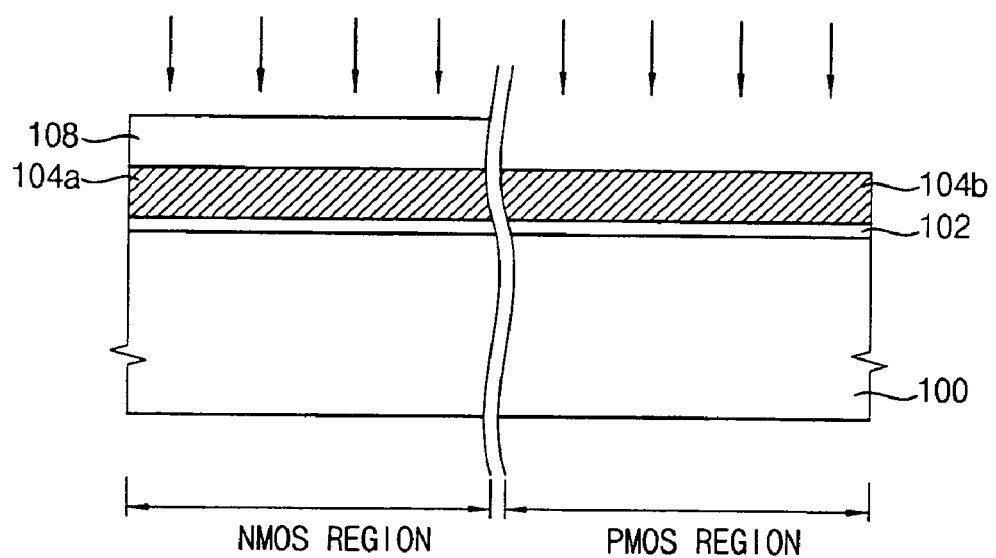

Referring to FIG. 6, p-type impurities may be implanted into the exposed second portion of the amorphous silicon layer 104 by a fourth ion implantation process using the second photoresist pattern 108 as an ion implantation mask, so that a second amorphous silicon layer 104b having a work function of about 4.6 eV to about 4.9 eV may be formed. Example of the p-type impurities may include boron.

The second photoresist pattern 108 may be removed by an ashing process and/or a stripping process.

In an example embodiment, the order of the third and fourth ion implantation processes may be switched, i.e., the fourth ion implantation process may be performed before the third ion implantation process. Additionally, the third and fourth ion implantation processes may be performed in situ.

The carbon ions may be ion implanted after the implantation of the P-type impurity into the amorphous silicon layer 104.

Additionally, the order of the ion implantation processes performed in the NMOS and PMOS regions may be changed. Particularly, the germanium ions and the n-type impurities may be implanted into the first portion of the amorphous silicon layer 104 in the NMOS region after the carbon ions and the p-type impurities are implanted into the second portion of the amorphous silicon layer 104 in the PMOS region.

Figure 7:
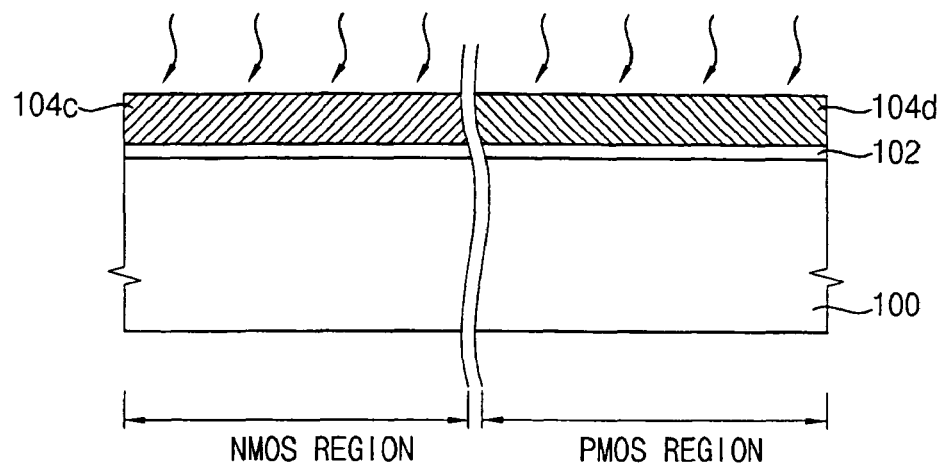

Referring to FIG. 7, a heat treatment process may be performed on the first and second amorphous silicon layers 104a and 104b, thereby activating the impurities therein. In the heat treatment process, the first and second silicon layers 104a and 104b may be changed to first and second polysilicon layers 104c and 104d, respectively.

If the heat treatment process is performed at a temperature of less than about 850° C., the activation efficiency of the impurities and the crystallization efficiency of silicon may not be good. If the heat treatment process is performed at a temperature of more than about 1000° C., an underlying layer, e.g., the gate insulation layer 102 and the substrate 100 may be deteriorated. Therefore, the heat treatment process may be performed at a temperature of about 850° C. to about 1000° C.

When the first amorphous silicon layer 104a is crystallized by the heat treatment process, the lattice parameter thereof may be increased by the germanium ions included in the first amorphous silicon layer 104a. Therefore, the substrate 100 under the first polysilicon layer 104c may be under tensile stress.

When the second amorphous silicon layer 104b is crystallized by the heat treatment process, the lattice parameter thereof may be decreased by the carbon ions included in the second amorphous silicon layer 104b. Therefore, the substrate 100 under the second polysilicon layer 104d may be under compressive stress.

Figure 8:
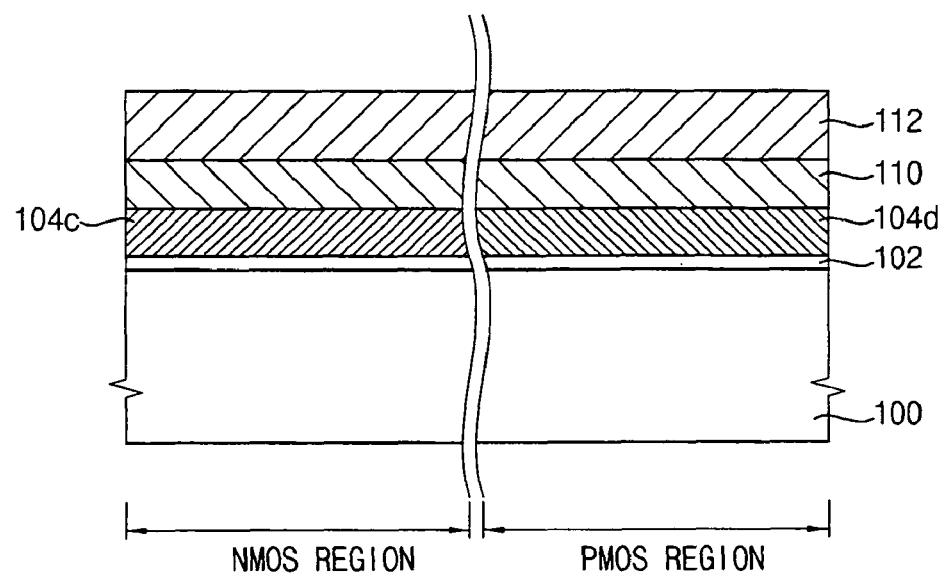

Referring to FIG. 8, a conductive layer 110 may be formed on the first and second polysilicon layers 104c and 104d. The conductive layer 110 may be formed using a metal. For example, the conductive layer 110 may be formed using tungsten, tungsten silicide, etc. These may be used alone or in a combination thereof.

A hard mask layer 112 may be formed on the conductive layer 110. The hard mask layer 112 may be formed using a silicon nitride.

As described above, the conductive layer 110 and the hard mask layer 112 may be sequentially formed on the first and second polysilicon layers 104c and 104d before patterning the first and second polysilicon layers 104c and 104d. Thus, the stress loaded on the substrate 100 may remain in subsequent process. If the first and second polysilicon layers 104c and 104d are patterned before forming the conductive layer 110 and the hard mask layer 112 thereon, the stress loaded on the substrate 100 may not remain.

Figure 9:
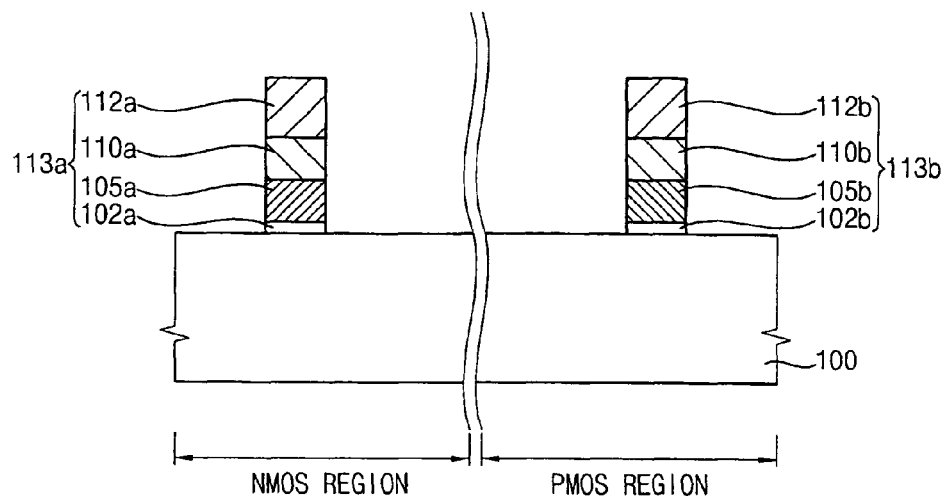

Referring to FIG. 9, the hard mask layer 112 may be patterned to form first and second hard masks 112a and 112b on the conductive layer 110 in the NMOS and PMOS regions, respectively.

The conductive layer 110, the first and second polysilicon layers 104c and 104d, and the gate insulation layer 102 may be patterned using the first and second hard masks 112a and 112b as an etching mask. Therefore, a first gate structure 113a including a first gate insulation layer pattern 102a, a first polysilicon layer pattern 105a, a first conductive layer pattern 110a and a first hard mask 112a sequentially stacked on the substrate 100 may be formed in the NMOS region. Additionally, a second gate structure 113b including a second gate insulation layer pattern 102b, a second polysilicon layer pattern 105b, a second conductive layer pattern 110b and a second hard mask 112b sequentially stacked on the substrate 100 may be formed in the PMOS region.

Referring to FIG. 1 again, a gate spacer layer may be further formed on the substrate 100 to cover the first and second gate structures. The gate spacer layer may be formed by a CVD process using a silicon nitride.

The gate spacer layer may be anisotropically etched so that first gate spacers 114a may be formed on sidewalls of the first gate structure 113a, and second gate spacers 114b may be formed on sidewalls of the second gate structure 113b.

A third photoresist pattern (not shown) covering the second gate structure 113b and the second gate spacers 114b may be formed on the substrate 100 in the PMOS region. N-type impurities may be implanted into first upper portions of the substrate 100 using the third photoresist pattern, the first gate structure 113a and the first gate spacers 114a as an ion implantation mask to form first impurity regions 116 adjacent to the first gate structure 113a. The third photoresist pattern may be removed. Thus, an NMOS transistor may be formed in the NMOS region.

Additionally, a fourth photoresist pattern (not shown) covering the first gate structure 113a and the first gate spacers 114a may be formed on the substrate 100 in the NMOS region. P-type impurities may be implanted into second upper portions of the substrate 100 using the fourth photoresist pattern, the second gate structure 113b and the second gate spacers 114b as an ion implantation mask to form second impurity regions 118 adjacent to the second gate structure 113b. The fourth photoresist pattern may be removed. Thus, a PMOS transistor may be formed in the PMOS region.

Figure 10:
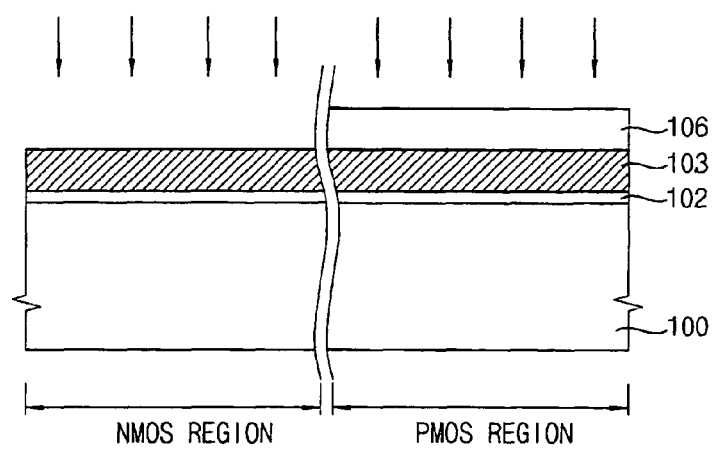

FIG. 10 is a cross-sectional view illustrating a method of manufacturing the CMOS transistor in FIG. 1 in accordance with example embodiments.

The method of manufacturing the CMOS transistor in accordance with example embodiments may be substantially the same as that illustrated with reference to FIGS. 2 to 9, except that n-type impurities may be doped into a first amorphous silicon layer in situ. Thus, like numerals refer to like elements, and repetitive explanations are omitted here.

Referring to FIG. 10, a gate insulation layer 102 may be formed on a substrate 100 divided into an NMOS region and a PMOS region. The gate insulation layer 102 may be formed using a silicon nitride.

A first amorphous silicon layer 103 doped with n-type impurities may be formed on the gate insulation layer 102. Particularly, the n-type impurities may be implanted into the first amorphous silicon layer 103 in situ when the first amorphous silicon layer 103 is formed.

A first photoresist pattern 106 may be formed on the first amorphous silicon layer 103. The first photoresist pattern may expose a first portion of the first amorphous silicon layer 103 in the NMOS region and cover a second portion of the first amorphous silicon layer 103 in the PMOS region.

Atoms having a larger size than that of silicon may be implanted into the exposed first portion of the first amorphous silicon layer 103 by a first ion implantation process using the first photoresist pattern 106 as an ion implantation mask. In example embodiments, germanium ions may be implanted into the first portion of the amorphous silicon layer 103. The first ion implantation process may be substantially the same as that illustrated with reference to FIG. 3.

In the present embodiment, the first amorphous silicon layer 103 may be doped with the n-type impurities in situ when the first amorphous silicon layer 103 is formed; so that an additional implantation process for doping n-type impurities thereinto may be omitted.

Processes substantially the same as those illustrated with reference to FIGS. 5 to 9 and FIG. 1 may be performed to complete the CMOS transistor of FIG. 1.

Figure 11:
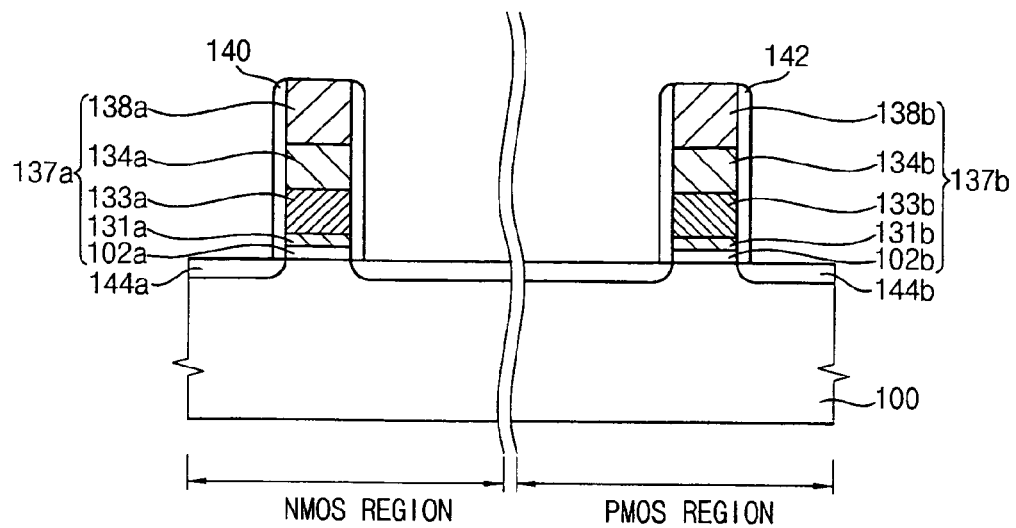

FIG. 11 is a cross-sectional view illustrating a CMOS transistor in accordance with example embodiments.

Referring to FIG. 11, substrate 100 including a semiconductor material may be provided. The substrate 100 may include single crystalline silicon.

The substrate 100 may be divided into an NMOS region and a PMOS region. Additionally, the substrate 100 may be divided into an active region and a field region.

The CMOS transistor may include an NMOS transistor and a PMOS transistor in the NMOS region and the PMOS region, respectively.

The NMOS transistor may include a first gate structure 137a and first impurity regions 144a. The first gate structure 137a may be formed on the substrate 100 in the NMOS region. The first impurity regions 144a may be formed at upper portions of the substrate 100 adjacent to the first gate structure 137a. Additionally, the NMOS transistor may include first gate spacers 140 on sidewalls of the first gate structure 137a.

The first gate structure 137a may have a first gate insulation layer pattern 102a, a first lower polysilicon layer pattern 131a, a first upper polysilicon layer pattern 133a including atoms having a larger size than that of silicon, a first conductive layer pattern 134a and a first hard mask 138a sequentially stacked on the substrate 100 in the NMOS region.

The first gate insulation layer pattern 102a may include a silicon oxide.

The first lower polysilicon layer pattern 131a may include n-type impurities. The first lower polysilicon layer pattern 131a may have a proper work function for serving as a gate electrode of the NMOS transistor because of the n-type impurities. The first lower polysilicon layer pattern 131a may not include atoms having a larger size than that of silicon.

The first lower polysilicon layer pattern 131a may serve as a buffer layer that may prevent the atoms having the larger size than that of silicon implanted into the first upper polysilicon layer pattern 133a from changing characteristics of the first gate insulation layer pattern 102a. The above atoms implanted into the first upper polysilicon layer pattern 133a may not directly contact the first gate insulation pattern 102a because of the first lower polysilicon layer pattern 131a.

When the first lower polysilicon layer pattern 131a has a thickness less than about 30 Å, the first lower polysilicon layer pattern 131a may not sufficiently perform as the buffer layer. When the first lower polysilicon layer pattern 131a has a thickness more than about 100 Å, the first upper polysilicon layer pattern 133a may be too far from the substrate 100 to load stress thereon. Therefore, the first lower polysilicon layer pattern 131a may have a thickness in a range of about 30 Å to about 100 Å.

The first upper polysilicon layer pattern 133a may include the n-type impurities. Additionally, the first upper polysilicon layer pattern 133a may include atoms having a larger size than that of silicon. In example embodiments, the first upper polysilicon layer pattern 133a may include germanium ions. Particularly, an amount of the germanium ions implanted into the first upper polysilicon layer pattern 133a may be in a range of about 1% to about 30% by atomic percent. The first upper polysilicon layer pattern 133a may include any atoms that may substantially increase the polysilicon lattice parameter thereof.

The conductive layer pattern 134a may include a metal. Examples of the conductive layer pattern 134a may include tungsten, tungsten silicide, etc.

The first hard mask 138a may include a silicon nitride.

The first impurity regions 144a serving as source/drain regions may be doped with n-type impurities.

The PMOS transistor may include a second gate structure 137b and second impurity regions 144b. The second gate structure 137b may be formed on the substrate 100 in the PMOS region. The second impurity regions 144b may be formed at upper portions of the substrate 100 adjacent to the second gate structure 137b. Additionally, the PMOS transistor may include second gate spacers 142 on sidewalls of the second gate structure 137b.

The second gate structure 137b may have a second gate insulation layer pattern 102b, a second lower polysilicon layer pattern 131b, a second upper polysilicon layer pattern 133b including atoms having a smaller size than that of silicon, a second conductive layer pattern 134b and a second hard mask 138b sequentially stacked on the substrate 100 in the PMOS region.

The second gate insulation layer pattern 102b may include a silicon oxide.

The second lower polysilicon layer pattern 131b may include p-type impurities. The second lower polysilicon layer pattern 131b may not include atoms having a smaller size than that of silicon.

The second lower polysilicon layer pattern 131b may serve as a buffer layer that may prevent the atoms having the smaller size than that of silicon implanted into the second upper polysilicon layer pattern 133b from changing characteristics of the second gate insulation layer pattern 102b. The above atoms implanted into the second upper polysilicon layer pattern 133b may not directly contact the second gate insulation pattern 102b because of the second lower polysilicon layer pattern 131b.

When the second lower polysilicon layer pattern 131b has a thickness less than about 30 Å, the second lower polysilicon layer pattern 131b may not sufficiently perform as the buffer layer. When the second lower polysilicon layer pattern 131b has a thickness more than about 100 Å, the second upper polysilicon layer pattern 133b may be too far from the substrate 100 to load stress thereon. Therefore, the second lower polysilicon layer pattern 131b may have a thickness in a range of about 30 Å to about 100 Å.

The second upper polysilicon layer pattern 133b may include the p-type impurities. Additionally, the second upper polysilicon layer pattern 133b may include atoms having a smaller size than that of silicon. In example embodiments, the second upper polysilicon layer pattern 133b may include carbon ions. Particularly, an amount of the carbon ions implanted into the second upper polysilicon layer pattern 133b may be in a range of about 1% to about 5% by atomic percent. The second upper polysilicon layer pattern 133b may include any atoms that may substantially increase a polysilicon lattice parameter.

The second conductive layer pattern 134b may include a metal. Examples of the conductive layer pattern 134b may include tungsten, tungsten silicide, etc.

Second spacers 142 may be formed on sidewalls of the second gate structure 113b. The second spacers 142 may include a silicon nitride.

The second impurity regions 144b serving as source/drain regions may be doped with p-type impurities. In example embodiments, the second impurity regions 144b may have a LDD structure including a lightly doped region and a heavily doped region.

As described above, the substrate 100 may be under different stress in the NMOS and PMOS regions, which may serve as channel regions of the NMOS and PMOS transistors, respectively, so that the mobility of the carriers of the CMOS transistor may be increased, and the operation characteristics of the CMOS transistor may be improved.

FIGS. 12 to 15 are cross-sectional views illustrating a method of manufacturing the CMOS transistor in FIG. 11 in accordance with example embodiments.

Figure 12:
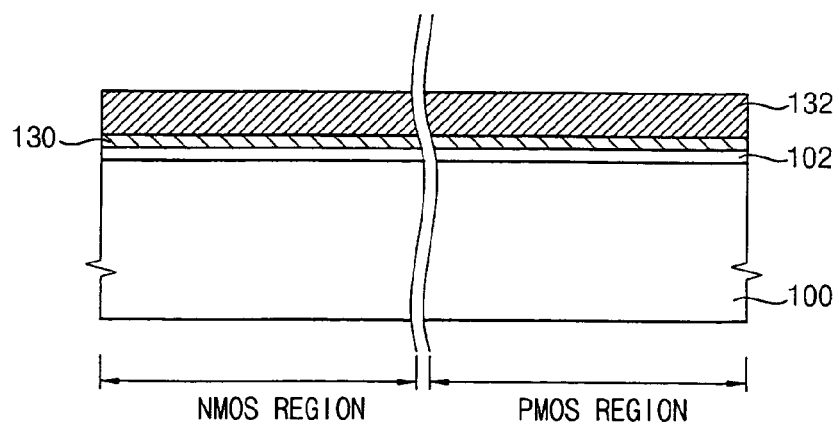

Referring to FIG. 12, a substrate 100 including a semiconductor material, e.g., single crystalline silicon may be provided. The substrate 100 may be divided into an NMOS region and a PMOS region. A gate insulation layer 102 may be formed on the substrate 100 using a silicon oxide. In example embodiments, the gate insulation layer 102 may be formed by oxidizing a top surface of the substrate 100.

A lower amorphous silicon layer 130 that is not doped with impurities may be formed on the gate insulation layer 102. The lower amorphous silicon layer 130 may be formed to have a thickness in a range of about 30 Å to about 100 Å. The lower amorphous silicon layer 130 may be formed by a CVD process using a precursor including silicon as a reaction gas. If the CVD process is performed at a temperature of more than about 600° C., a crystalline silicon layer may be formed. Therefore, the lower amorphous silicon layer 130 may be formed at a temperature of less than about 600° C. Examples of the reaction gas may include dichlorosilane (DCS, $SiCl_2H_2$), silane ($SiH_4$), disilane ($Si_2H_6$), etc.

An upper amorphous silicon layer 132 including atoms having a larger size than that of silicon may be formed on the lower amorphous silicon layer 130. Particularly, a source gas including the atoms having a larger size than that of silicon may be further provided so that the upper amorphous silicon layer 132 including the atoms having a larger size than that of silicon may be formed. The above atoms may cause tensile stress on the substrate 100.

In example embodiments, the upper amorphous silicon layer 132 may be formed to include germanium ions. An amount of the germanium ions implanted into the upper amorphous silicon layer 132 may be in a range of about 1% to about 30% by atomic percent.

The upper amorphous silicon layer 132 may be formed by a CVD process using a first precursor including silicon and a second precursor including germanium as a reaction gas. If the CVD process is performed at a temperature of more than about 600° C., a crystalline silicon layer may be formed. Therefore, the upper amorphous silicon layer 132 may be formed at a temperature of less than about 600° C. Examples of the reaction gas may include dichlorosilane (DCS, $SiCl_2H_2$), silane ($SiH_4$), disilane ($Si_2H_6$), etc. Examples of the precursor including germanium may include germane ($GeH_4$).

In example embodiments, the lower amorphous silicon layer 130 and the upper amorphous silicon layer 132 may be formed in situ. The lower amorphous silicon layer 130 not doped with germanium ions may be formed on the gate insulation layer 102, and thus the upper amorphous silicon layer 132 including germanium ions may not directly contact the gate insulation layer 102.

Figure 13:
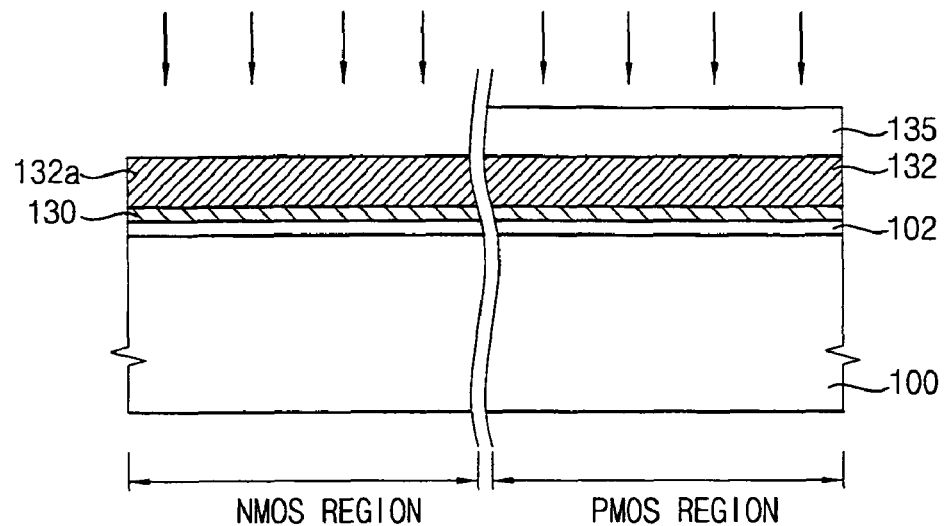

Referring to FIG. 13, the upper amorphous silicon layer 132 may be coated with a first photoresist pattern 135. The first photoresist pattern 135 may expose a first portion of the upper amorphous silicon layer 132 in the NMOS region and cover a second portion of the upper amorphous silicon layer 132 in the PMOS region.

N-type impurities may be implanted into the first portion of the upper amorphous silicon layer 132 using the first photoresist pattern 135 as an implantation mask so that a first upper amorphous silicon layer 132a may be formed. By implanting the n-type impurities, the first upper amorphous silicon layer 132a and the lower amorphous silicon layer 130 may have a desired work function. For example, the n-type impurities may include arsenic, phosphorus, etc.

The first photoresist pattern 135 may be removed by an ashing process and/or a stripping process.

In an example embodiment, in the process of forming the upper amorphous silicon layer 132 including germanium ions, the n-type impurities may be implanted into the upper amorphous silicon layer 132 in situ. In this case, an additional implantation process for doping n-type impurities into the upper amorphous silicon layer 132 may not be needed. Therefore, the processes of forming the first photoresist pattern 135 and implanting the n-type impurities into the upper amorphous silicon layer 132 illustrated with reference to FIG. 13 may be skipped.

Figure 14:
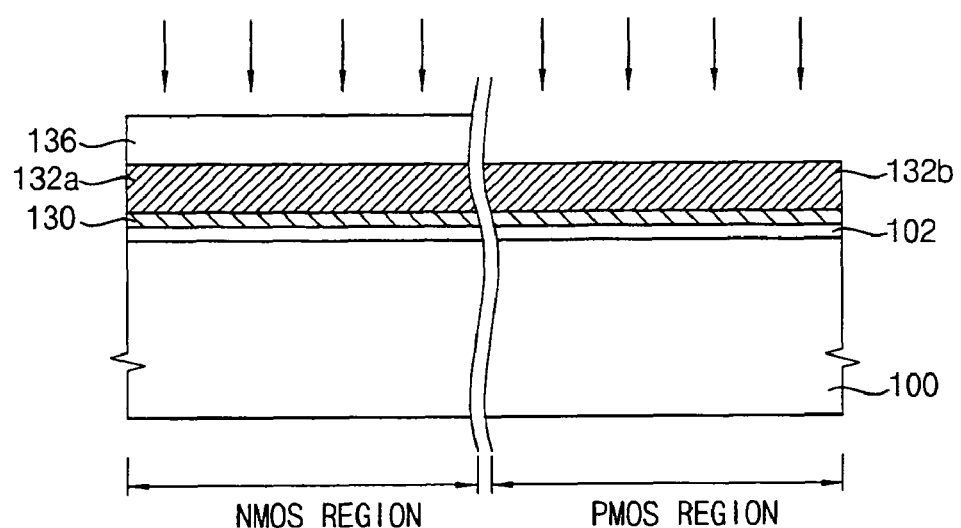

Referring to FIG. 14, the first upper amorphous silicon layer 132a may be coated with a second photoresist pattern 136, which exposes the second portion of the upper amorphous silicon layer 132 in the PMOS region.

Atoms having a smaller size than that of silicon may be implanted into the second portion of the upper amorphous silicon layer 132 using the second photoresist pattern 136 as an ion implantation mask. In example embodiments, carbon ions may be implanted into the second portion of the upper amorphous silicon layer 132. An amount of carbon ions implanted into the upper amorphous silicon layer 132 may be in a range of about 1% to about 5% by atomic percent. Alternatively nitrogen ions or oxygen ions may be implanted into the second portion of the upper amorphous silicon layer 132 in addition to or instead of the carbon ions.

P-type impurities may be implanted into the exposed second portion of the upper amorphous silicon layer 132 using the second photoresist pattern 136 as an implantation mask. Examples of the p-type impurities may include boron. Thus, a second upper amorphous silicon layer 132b including p-type impurities and carbon ions may be formed in the PMOS region.

The second photoresist pattern 136 may be removed by an ashing process and/or a stripping process.

Figure 15:
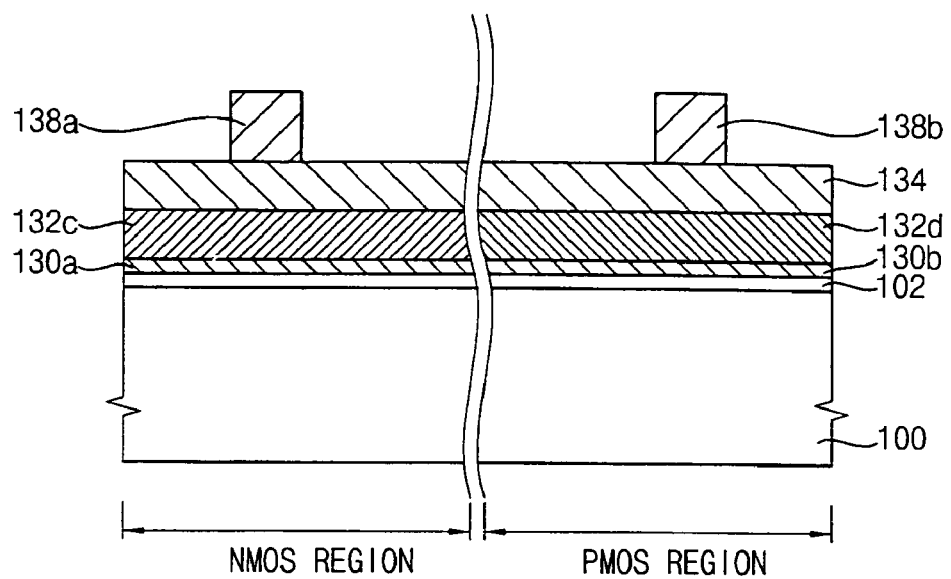

Referring to FIG. 15, the heat treatment process may be performed on the first and second upper amorphous silicon layers 132a and 132b and the lower amorphous silicon layer 130, thereby to activate the impurities therein and crystallize the first and second upper amorphous silicon layers 132a and 132b and the lower amorphous silicon layer 130. Therefore, a first lower polysilicon layer 130a and a first upper polysilicon layer 132c may be formed in the NMOS region, and a second lower polysilicon layer 130b and a second upper polysilicon layer 132d may be formed in the PMOS region. The heat treatment process may be substantially the same as that illustrate with reference to FIG. 7.

A conductive layer 134 may be formed on the first and second upper polysilicon layers 132c and 132d. The conductive layer 134 may be formed using a metal. A hard mask layer may be formed on the conductive layer 134. The hard mask layer may be formed by depositing a silicon nitride. The hard mask layer may be patterned to form a first hard mask 138a and a second hard mask 138b in the NMOS region and the PMOS region, respectively.

Referring to FIG. 11 again, the conductive layer 134, the first upper polysilicon layer 132c, the second upper polysilicon layer 132d, the first lower polysilicon layer 130a, the second lower polysilicon layer 130b and the gate insulation layer 102 may be patterned using the first and second hard masks 138a and 138b as an etching mask.

Therefore, a first gate structure 137a including the first gate insulation layer pattern 102a, the first lower polysilicon layer pattern 131a, the first upper polysilicon layer pattern 133a, the first conductive layer pattern 134a and the first hard mask 138a sequentially stacked on the substrate 100 may be formed in the NMOS region. Additionally, a second gate structure 137b including the second gate insulation layer pattern 102b, the second lower polysilicon layer pattern 131b, the second upper polysilicon layer pattern 133b, the second conductive layer pattern 134b and the second hard mask 138b sequentially stacked on the substrate 100 may be formed in the PMOS region.

First spacers 140 may be formed on sidewalls of the first gate structure 137a, and second spacers 142 may be formed on the sidewalls of the second gate structure 137b. N-type impurities may be implanted into first upper portions of the substrate 100 using the first gate structure 137a and the first spacers 140 as an ion implantation mask to form first impurity regions 144a adjacent to the first gate structure 137a. Additionally, p-type impurity may be implanted into second upper portions of the substrate 100 using the second gate structure 137b and the second spacers 142 as an ion implantation mask to form second impurity regions 144b adjacent to the second gate structure 137b. Thus, the CMOS transistor in FIG. 11 may be manufactured.

FIGS. 16 to 19 are cross-sectional views illustrating a method of manufacturing the CMOS transistor in FIG. 11 in accordance with example embodiments.

Figure 16:
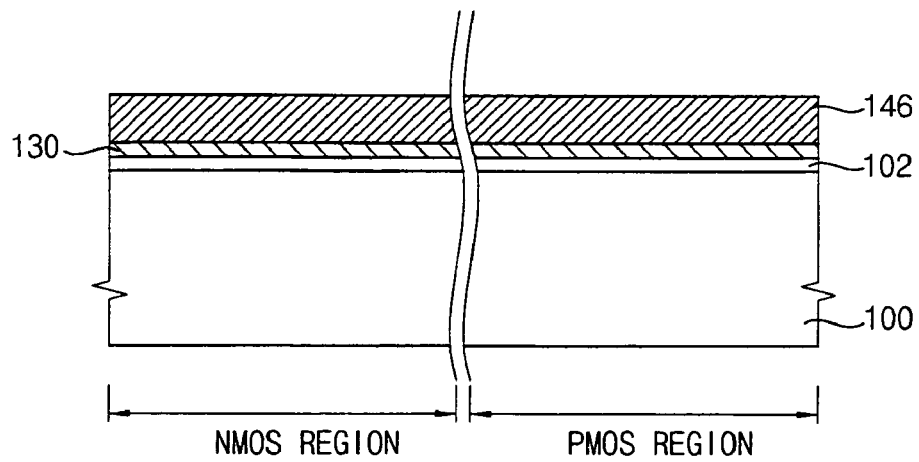

Referring to FIG. 16, a substrate 100 including a semiconductor material, e.g., single crystalline silicon may be provided. The substrate 100 may be divided into an NMOS region and a PMOS region. A gate insulation layer 102 may be formed on the substrate 100 using a silicon oxide. In example embodiments, the gate insulation layer 102 may be formed by oxidizing a top surface of the substrate 100.

A lower amorphous silicon layer 130 that is not doped with impurities may be formed on the gate insulation layer 102. The lower amorphous silicon layer 130 may be formed to have a thickness in a range of about 30 Å to about 100 Å.

An upper amorphous silicon layer 146 including atoms having a smaller size than that of silicon may be formed on the lower amorphous silicon layer 130. Particularly, a source gas including the atoms having a smaller size than that of silicon may be further provided so that the upper amorphous silicon layer 146 including the atoms having a smaller size than that of silicon may be formed. The above atoms may cause compressive stress on the substrate 100.

In example embodiments, the upper amorphous silicon layer 146 may be formed to include carbon ions. An amount of the carbon ions implanted into the upper amorphous silicon layer 146 may be in a range of about 1% to about 5% by atomic percent.

The upper amorphous silicon layer 146 may be formed by a CVD process using a first precursor including silicon and a second precursor including carbon as a reaction gas. If the CVD process is performed at a temperature of more than about 600° C., a crystalline silicon layer may be formed. Therefore, the upper amorphous silicon layer 146 may be formed at a temperature of less than about 600° C. Examples of the reaction gas may include dichlorosilane (DCS, $SiCl_2H_2$), silane ($SiH_4$), disilane ($Si_2H_6$), etc. Examples of the precursor including carbon may include methyl ($CH_3$), carbon tetrafluoride ($CF_4$), etc.

In example embodiments, the lower amorphous silicon layer 130 and the upper amorphous silicon layer 146 may be formed in situ.

Figure 17:
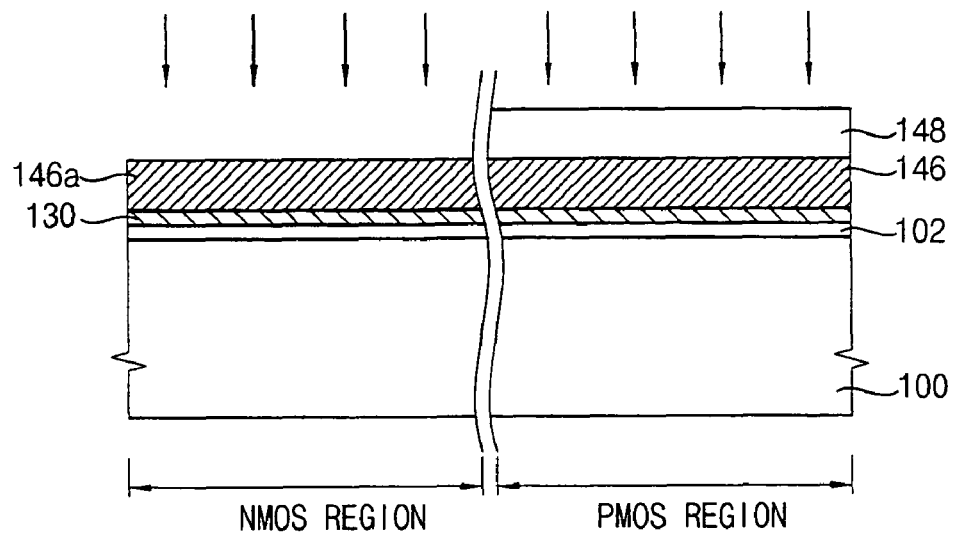

Referring to FIG. 17, the upper amorphous silicon layer 146 may be coated with a first photoresist pattern 148. The first photoresist pattern 148 may expose a first portion of the upper amorphous silicon layer 146 in the NMOS region and cover a second portion of the upper amorphous silicon layer 146 in the PMOS region.

N-type impurities may be implanted into the first portion of the upper amorphous silicon layer 146 using the first photoresist pattern 148 as an ion implantation mask. In example embodiments, germanium ions may be implanted into the amorphous silicon layer 146. An amount of the germanium ions implanted into the amorphous silicon layer 146 may be in a range of about 1% to about 30% by atomic percent. Alternatively, nitrogen ions or oxygen ions may be implanted in addition to or instead of the carbon ions.

Additionally, n-type impurities may be implanted into the upper amorphous silicon layer 146 using the first photoresist pattern 148 as an ion implantation mask so that a first upper amorphous silicon layer 146a may be formed.

In an example embodiment, in the process of forming the upper amorphous silicon layer 146 including carbon ions, the n-type impurities may be implanted into the upper amorphous silicon layer 146 in situ. In this case, an additional implantation process for doping n-type impurities into the upper amorphous silicon layer 146 may not be needed. Therefore, the processes for forming the first photoresist pattern 148 and implanting the n-type impurities into the upper amorphous silicon layer 146 illustrated with reference to FIG. 13 may be skipped.

Figure 18:
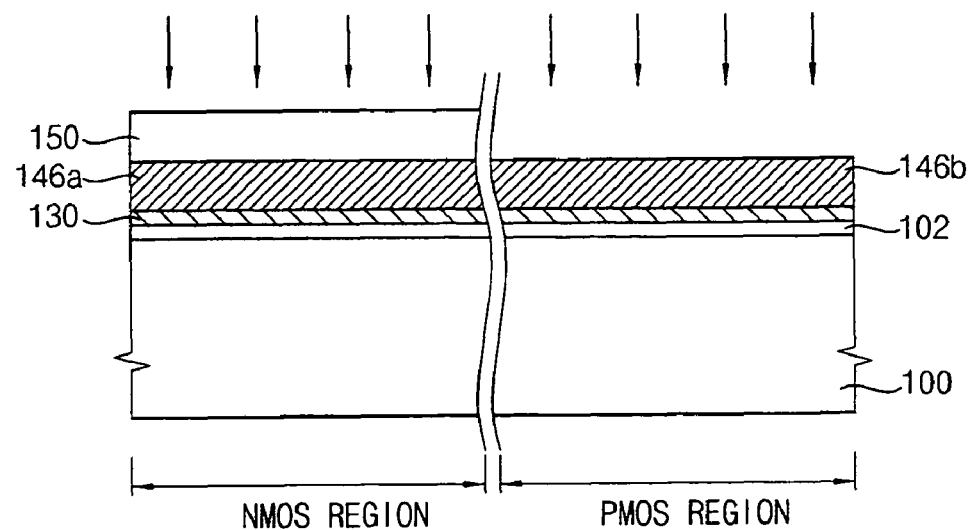

Referring to FIG. 18, the first upper amorphous silicon layer 146a may be coated with a second photoresist pattern 150, which exposes the second portion of the upper amorphous silicon layer 146 in the PMOS region.

P-type impurities may be implanted into the exposed second portion of the upper amorphous silicon layer 146 using the second photoresist pattern 150 as an ion implantation mask. Examples of the p-type impurities may include boron. Thus, a second upper amorphous silicon layer 146b including p-type impurities and carbon ions may be formed in the PMOS region.

The second photoresist pattern 150 may be removed by an ashing process and/or a stripping process.

Figure 19:
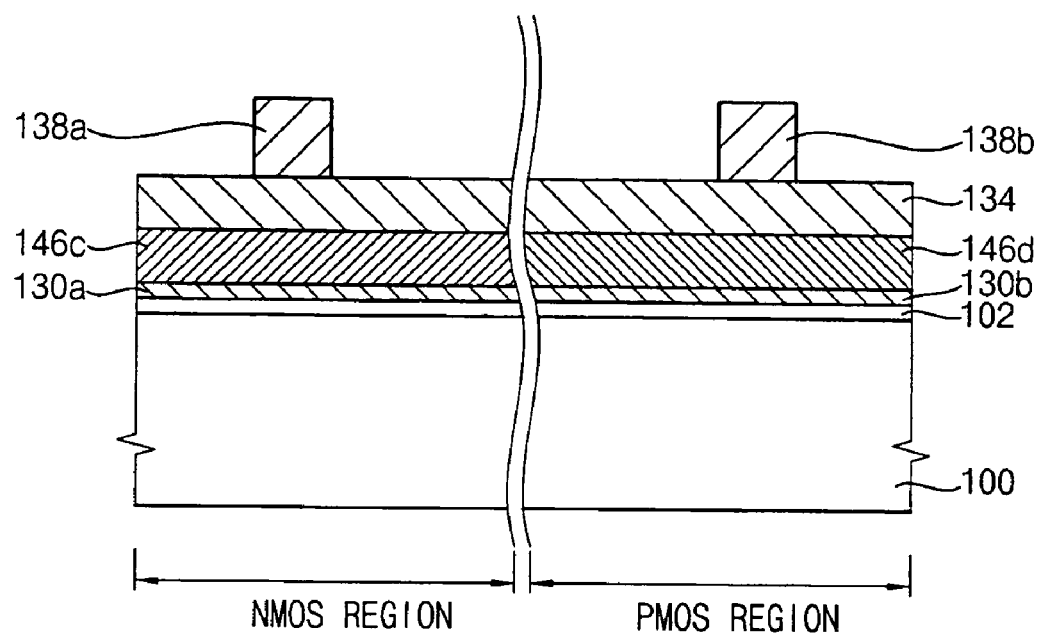

Referring to FIG. 19, a heat treatment process may be performed on the first and second upper amorphous silicon layers 146a and 146b and the lower amorphous silicon layer 130, thereby to activate the impurities therein and crystallize the first and second upper amorphous silicon layers 146a and 146b and the lower amorphous silicon layer 130. Therefore, a first lower polysilicon layer 130a and a first upper polysilicon layer 146c may be formed in the NMOS region, and a second lower polysilicon layer 130b and a second upper polysilicon layer 146d may be formed in the PMOS region. The heat treatment process may be substantially the same as that illustrated with reference to FIG. 7

A conductive layer 134 may be formed on the first and second upper polysilicon layers 146c and 146d. The conductive layer 134 may be formed using a metal. A hard mask layer may be formed on the conductive layer 134. The hard mask layer may be formed by depositing a silicon nitride. The hard mask layer may be patterned to form a first hard mask 138a and a second hard mask 138b in the NMOS region and the PMOS region, respectively.

Referring to FIG. 11 again, the conductive layer 134, the first upper polysilicon layer 146c, the second upper polysilicon layer 146d, the first lower polysilicon layer 130a, the second lower polysilicon layer 130b and the gate insulation layer 102 may be patterned using the first and second hard masks 138a and 138b as an etching mask.

Therefore, a first gate structure 137a including the first gate insulation layer pattern 102a, the first lower polysilicon layer pattern 131a, the first upper polysilicon layer pattern 133a, the first conductive layer pattern 134a and the first hard mask 138a sequentially stacked on the substrate 100 may be formed in the NMOS region. Additionally, a second gate structure 137b including the second gate insulation layer pattern 102b, the second lower polysilicon layer pattern 131b, the second upper polysilicon layer pattern 133b, the second conductive layer pattern 134b and the second hard mask 138b sequentially stacked on the substrate 100 may be formed in the PMOS region.

First spacers 140 may be formed on sidewalls of the first gate structure 137a, and second spacers 142 may be formed on the sidewalls of the second gate structure 137b. N-type impurities may be implanted into the substrate 100 in the NMOS region using the first gate structure 137a and the first spacers 140 as an ion implantation mask to form first impurity regions 144a at first upper portions of the substrate 100 adjacent to the first gate structure 137a. Additionally, p-type impurity may be implanted into the substrate 100 in the PMOS region using the second gate structure 137b and the second spacers 142 as an ion implantation mask to form second impurity regions 144b at second upper portions of the substrate 100 adjacent to the second gate structure 137b. Thus, the CMOS transistor in FIG. 11 may be manufactured.

Figure 20:
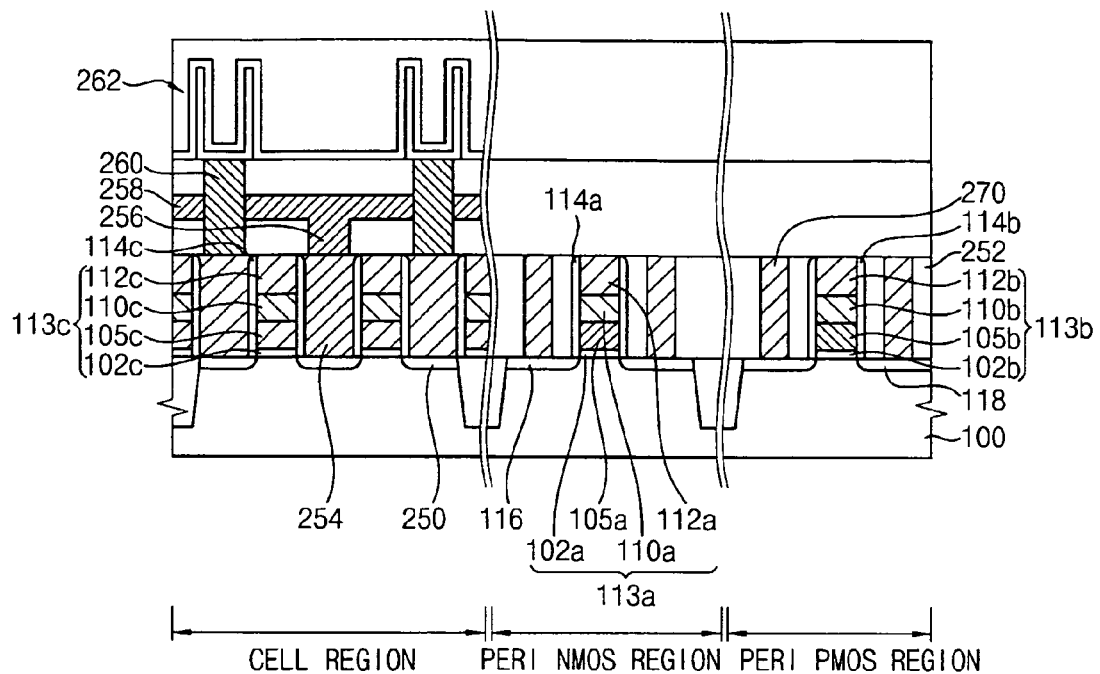

FIG. 20 is cross-sectional view illustrating a dynamic random access memory (DRAM) device in accordance with example embodiments.

The DRAM device may include a CMOS transistor in a peripheral circuit region. The CMOS transistor may be substantially the same as that of FIG. 1.

Referring to FIG. 20, a substrate 100 including a semiconductor material, e.g., single crystalline silicon may be provided.

The substrate 100 may be divided into a cell region and the peripheral circuit region. Cells of the DRAM may be formed in the cell region, and peripheral circuits may be formed in the peripheral circuit region. Additionally, the peripheral circuit region may be divided into an NMOS region (hereinafter, referred to as a peri NMOS region), and a PMOS region (hereinafter, referred to as a peri PMOS region). Furthermore, the substrate 100 may be divided into an active region and a field region.

The NMOS transistor of FIG. 1 may be formed in the peri NMOS region. Additionally, the PMOS transistor of FIG. 1 may be formed in the peri PMOS region. The NMOS transistor in the peri NMOS region may be formed on a first portion of the substrate 100 under tensile stress, so that the mobility of electrons may be increased. Additionally, the PMOS transistor formed in the peri PMOS region may be formed on a second portion of the substrate 100 under compressive stress, so that the mobility of holes may be increased. Therefore, the operation characteristics of the NMOS transistor and the PMOS transistor in the peripheral circuit region may be good.

An insulating interlayer 252 covering the NMOS transistor and the PMOS transistor may be formed on the substrate 100. A contact 270 and wirings (not shown) electrically connected to impurity regions 116 and 118 of the NMOS and PMOS transistors and gate electrodes 105a, 110a, 105b, 110b may be formed.

A unit cell of the DRAM may include a cell transistor and a capacitor. Therefore, the substrate 100 in the cell region may include a plurality of the cell transistors and a plurality of capacitors. In example embodiments, the cell transistors may be NMOS transistors.

The cell transistor in the cell region may include a third gate structure 113c. The third gate structure 113c may include a third gate insulation layer pattern 102c, a third polysilicon layer pattern 105c doped with n-type impurities, a third conductive layer pattern 110c and a third hard mask 112c sequentially stacked on the substrate 100. Additionally, third impurity regions 250 may be formed at upper portions of the substrate 100 adjacent to the third gate structure 113c.

The third conductive layer pattern 110c may include a material substantially the same as that of the first and second conductive layer patterns 110a and 110b of the transistors in the peripheral circuit region. Additionally, the third hard mask 112c may include a material substantially the same as that of the first and second hard masks 112a and 112b.

The third polysilicon layer pattern 105c may not include atoms causing stresses to the substrate 100 so that a portion of the substrate 100 in the cell region may not under any stress.

Contact plugs 254 electrically connected to the third impurity regions 250 may be formed on the substrate 100. A bit line contact 256 and a bit line 258 electrically connected to one of the contact plugs 254 may be formed. Additionally, a storage node contact 260 and a capacitor 262 electrically connected to one of the contact plugs 254 may be formed.

As described above, the DRAM device in accordance with example embodiments may include the CMOS transistor having good characteristics in the peripheral circuit region. Therefore, the DRAM device may have a high signal processing speed.

FIGS. 21 to 24 are cross-sectional views illustrating a method of manufacturing the DRAM devices in FIG. 20 in accordance with example embodiments.

Figure 21:
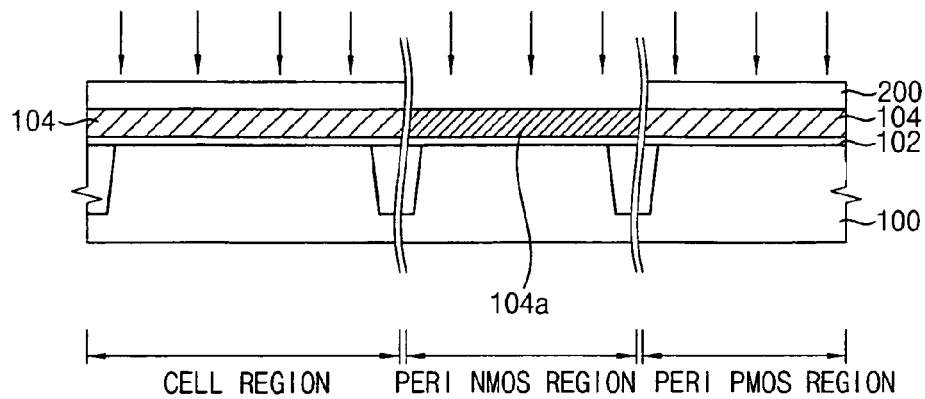

Referring to FIG. 21, a substrate 100 including a semiconductor material, e.g., single crystalline silicon may be provided. The substrate 100 may be divided into a cell region, a peri NMOS region and a peri PMOS region. A gate insulation layer 102 may be formed on the substrate 100 using a silicon oxide. In example embodiments, the gate insulation layer 102 may be formed by oxidizing a top surface of the substrate 100. The gate insulation layer 102 may be formed to have a thickness changing according to a position thereof, e.g., in the cell region, the peri NMOS region and the peri PMOS region.

An amorphous silicon layer 104 that is not doped with impurities may be formed on the gate insulation layer 102.

The amorphous silicon layer 104 may be coated with a first photoresist film, and the first photoresist film may be patterned to form a first photoresist pattern 106. The first photoresist pattern 106 may expose a first portion of the amorphous silicon layer 104 in the peri NMOS region, and cover a second portion of the amorphous silicon layer 104 in the peri PMOS region and a third portion of the amorphous silicon layer 104 in the cell region.

Atoms having a larger size than that of silicon may be implanted into the first portion of the amorphous silicon layer 104 using the first photoresist pattern 106 as an ion implantation mask. In example embodiments, the atoms may be implanted into the first portion of the amorphous silicon layer 104 not to contact the gate insulation layer 102.

In an example embodiment, germanium ions may be implanted into the first portion of the amorphous silicon layer 104. An amount of the germanium ions implanted into the amorphous silicon layer 104 may be in a range of about 1% to about 30% by atomic percent.

Additionally, n-type impurities may be implanted into the first portion of the amorphous silicon layer 104 using the first photoresist pattern 200 as an ion implantation mask. Thus, a first amorphous silicon layer 104a may be formed in the peri NMOS region.

The first photoresist pattern 200 may be removed by an ashing process and/or a stripping process.

Figure 22:
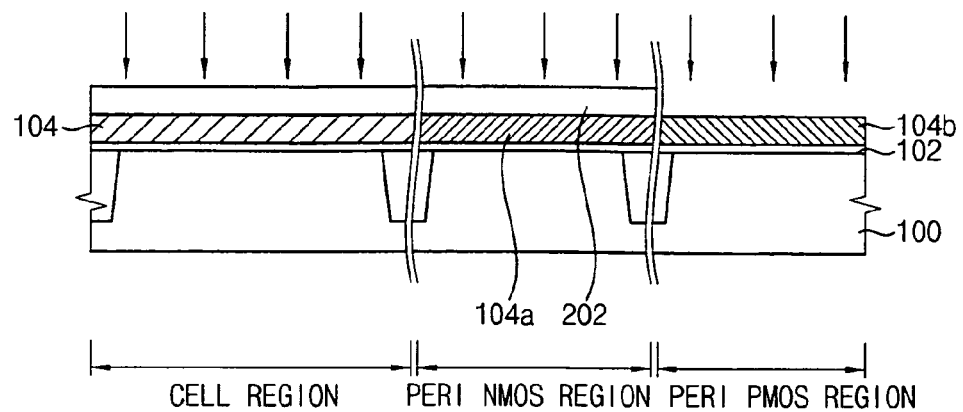

Referring to FIG. 22, the first amorphous silicon layer 104a may be coated with a second photoresist film, and the second photoresist film may be patterned to form a second photoresist pattern 202. The second photoresist pattern 202 may expose the second portion of the amorphous silicon layer 104 in the peri PMOS region, and cover the first portion of the amorphous silicon layer 104 in the peri NMOS region and the third portion of the amorphous silicon layer 104 in the cell region.

Atoms having a smaller size than that of silicon may be implanted into the second portion of the amorphous silicon layer 104 by the second photoresist pattern 202 as an ion implantation mask. In example embodiments, the atoms may be implanted into the second portion of the amorphous silicon layer 104 not to contact the gate insulation layer 102.

In an example embodiment, carbon ions may be implanted into the second portion of the amorphous silicon layer 104. An amount of the carbon ions implanted into the amorphous silicon layer 104 may be in a range of about 1% to about 5% by atomic percent.

Additionally, p-type impurities may be implanted into the second portion of the amorphous silicon layer 104 using the second photoresist pattern 202 as an ion implantation mask. Thus, a second amorphous silicon layer 104b may be formed in the peri PMOS region.

The second photoresist pattern 202 may be removed by an ashing process and/or a stripping process.

Figure 23:
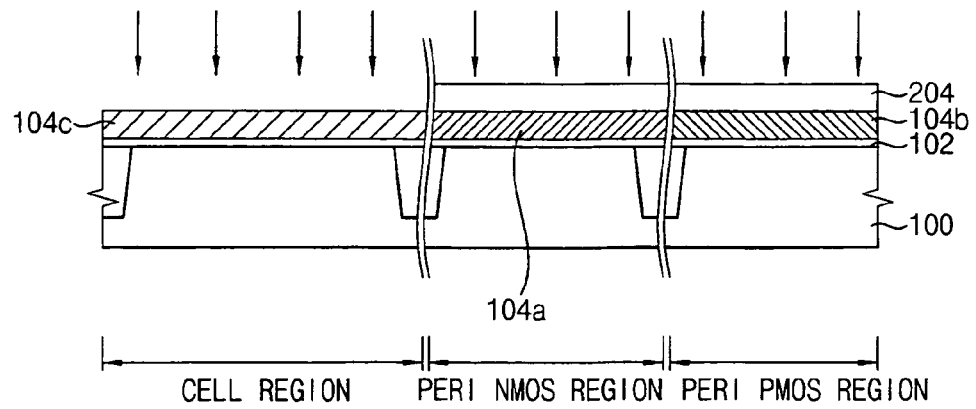

Referring to FIG. 23, the first amorphous silicon layer 104a, second amorphous silicon layer 104b and the amorphous silicon layer 104 may be coated with a third photoresist film. The third photoresist film may be patterned to form a third photoresist pattern 204. The third photoresist pattern 204 may expose the third portion of the amorphous silicon layer 104 in the cell region, and cover the first portion of the amorphous silicon layer 104 in the peri NMOS region and the second portion of the amorphous silicon layer 104 in the peri PMOS region.

N-type impurities may be implanted into the third portion of the amorphous silicon layer 104 by a fifth implantation process using the third photoresist pattern 204 as an ion implantation mask so that the third portion of the amorphous silicon layer 104 may have a desired work function. As a result, the third amorphous silicon layer 104c may be formed in the cell region.

Figure 24:
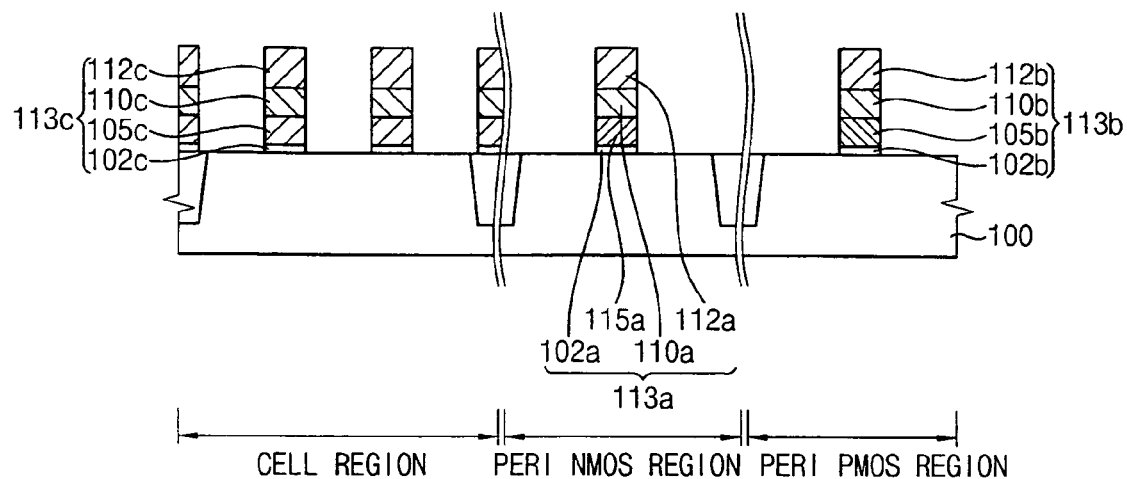

Referring to FIG. 24, a heat treatment process may be performed on the first to third amorphous silicon layers 104a, 104b and 104c, thereby activating the impurities therein. Thus, the first to third silicon layers 104a, 104b and 104c may be changed to first to third polysilicon layers, respectively.

A conductive layer may be formed on the first to third polysilicon layers. A hard mask layer may be formed on the conductive layer, and patterned to form first to third hard masks 112a, 112b and 112c in the peri NMOS region, the peri PMOS region and the cell region, respectively.

The conductive layer, the polysilicon layers and the gate insulation layer 102 may be patterned using the first to third hard masks 112a, 112b and 112c as an etching mask. As a result, a first gate structure 113a, a second gate structure 113b and a third gate structure 113c may be formed on the substrate 100 in the peri NMOS region, the peri PMOS region and the cell region, respectively. The first gate structure 113a may include a first gate insulation layer pattern 102a, a first polysilicon layer pattern 105a, a first conductive layer pattern 110a and the first hard mask 112a sequentially stacked on the substrate 100. The second gate structure 113b may include a second gate insulation layer pattern 102b, a second polysilicon layer pattern 105b, a second conductive layer pattern 110b and the second hard mask 112b sequentially stacked on the substrate 100. A third gate structure 113c may include a third gate insulation layer pattern 102c, a third polysilicon layer pattern 105c, a third conductive layer pattern 110c and the third hard mask layer pattern 112c sequentially stacked on the substrate 100.

Referring to FIG. 20 again, first, second and third spacers 114a, 114b and 114c may be formed on sidewalls of the first, second and third gate structures 113a, 113b and 113c, respectively. Additionally, first, second and third impurity regions 116, 118 and 250 may be formed at upper portions of the substrate 100 adjacent to the first, second and third gate structures 113a, 113b and 113c, respectively. The first and third impurity regions 116, 250 may be doped with n-type impurities, and the second impurity region 118 may be doped with p-type impurities. As a result, the cell transistor may be formed in the cell region, the NMOS transistor may be formed in the peri NMOS region and the PMOS transistor may be formed in the peri PMOS region.

An insulating interlayer 252 may be formed on the substrate 100 to cover the transistors.

Contact plugs 254 may be formed on the substrate 100 to be electrically connected to the impurity regions adjacent to the cell transistor. A bit line contact 256 and a bit line 258 may be formed on the contact plugs 254 to be electrically connected thereto. A storage node contact 260 and a capacitor 262 may be formed on one of the contact plugs 254 to be electrically connected thereto. Additionally, a contact 270 and wirings (not shown) may be formed on or over the substrate 100 to be electrically connected to impurity regions 116 and 118 of the NMOS and PMOS transistors and the gate electrodes 105a, 110a, 105b and 110b may be formed. By performing the process, the DRAM device in FIG. 20 may be manufactured.

Figure 25:
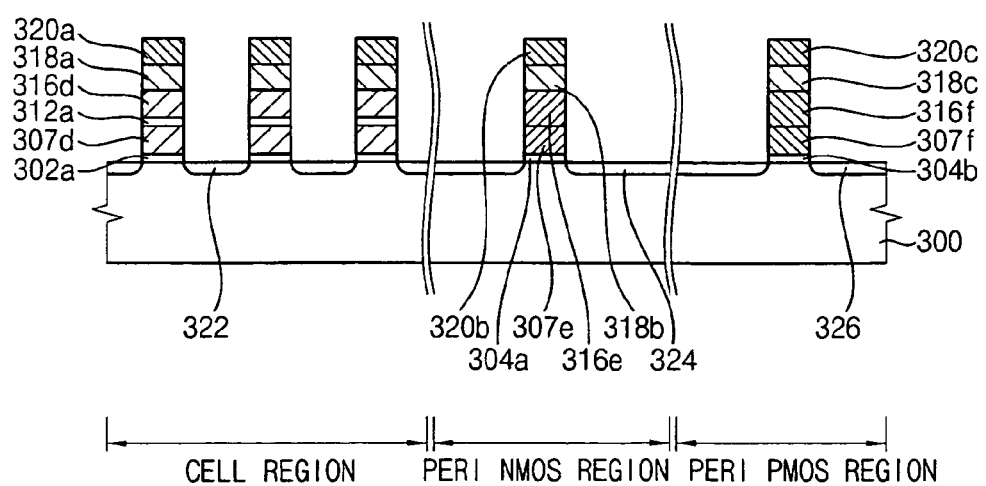

FIG. 25 is a cross-sectional view illustrating a NAND flash memory device in accordance with example embodiments.

The NAND flash memory device may include a CMOS transistor on a substrate 300 in a peripheral circuit region. The CMOS transistor may include an NMOS transistor and a PMOS transistor in a peri NMOS region and a peri PMOS region, respectively. The NAND flash memory device may further include a memory cell transistor on the substrate 300 in a cell region.

Referring to FIG. 25, a substrate 300 including a semiconductor material, e.g., single crystalline silicon may be provided.

A string of the NAND flash memory device may include a plurality of cell transistors connected to each other in series. Therefore, the substrate 300 in the cell region may include a plurality of cell transistors. Each cell transistor may include a first gate structure. The first gate structure may include a tunnel insulation layer pattern 302a, a first polysilicon layer pattern 307a, a dielectric layer pattern 312a, a fourth polysilicon layer pattern 316d, a first conductive layer pattern 318a and a first hard mask 320a sequentially stacked on the substrate 300 in the cell region. Additionally, first impurity regions 322 may be formed at first upper portions of the substrate 300 adjacent to the first gate structure.

The first polysilicon layer pattern 307a may serve as a floating gate. The fourth polysilicon layer pattern 316d and the first conductive layer pattern 318a may serve as a control gate. The first polysilicon layer pattern 307a may not include any atoms that may load stresses on the substrate 300, so that the substrate 300 in the cell region may be under no stress.

A second gate structure may be formed on the substrate 300 in the peri NMOS region. The second gate structure may include a second gate insulation layer pattern 304a, second and fifth polysilicon layer patterns 307e and 316e, a second conductive layer pattern 318b and a second hard mask 320b sequentially stacked on the substrate 300 in the peri NMOS region. The second and fifth polysilicon layer patterns 307e and 316e may include germanium. Second impurity regions 324 doped with n-type impurities may be formed at second upper portions of the substrate 300 adjacent to the second gate structure.

A third gate structure may be formed on the substrate 300 in the peri PMOS region. The third gate structure may include a third gate insulation layer pattern 304b, third and fifth polysilicon layer patterns 307f and 316f, a third conductive layer pattern 318c and a third hard mask 320c sequentially stacked on the substrate 300 in the peri PMOS region. The third and sixth polysilicon layer patterns 307f and 316f may include carbon. Third impurity regions 326 doped with p-type impurities may be formed at third upper portions of the substrate 300 adjacent to the third gate structure.

The NMOS transistor in the peri NMOS region may be under tensile stress, so that the mobility of electrons may be increased. Additionally, the PMOS transistor formed in the peri PMOS region may be under compressive stress so that the mobility of holes may be increased. Therefore, the operation characteristics of the NMOS transistor and the PMOS transistor formed in the peripheral circuit region may be good.

The first to third conductive layer patterns 318a, 318b and 318c may include substantially the same material. Additionally, the first to third hard masks 320a, 320b and 320c may include substantially the same material.

As described above, the NAND flash memory device in accordance with example embodiments may have the CMOS transistor having good characteristics in the peripheral circuit region, so that the NAND flash memory device may have high signal processing speed.

FIGS. 26 to 30 are cross-sectional views illustrating a method of manufacturing the NAND flash memory device in FIG. 25.

Figure 26:
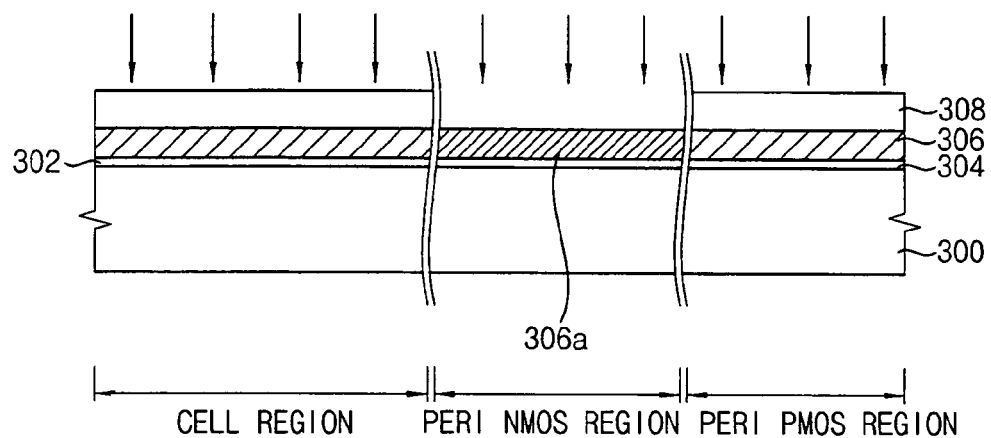

Referring to FIG. 26, a substrate 300 including a semiconductor material, e.g., single crystalline silicon may be provided. The substrate 300 may be divided into a peri NMOS region, a peri PMOS region and a cell region. A tunnel insulation layer 302 may be formed on the substrate 300 in the cell region. In example embodiments, the tunnel insulation layer 302 may be formed by oxidizing a top surface of the substrate 300 in the cell region. A gate insulation layer 304 may be formed on the substrate 300 in the peri NMOS region and the peri PMOS region. In example embodiments, a gate insulation layer 304 may be formed by oxidizing a top surface of the substrate 300 in the peri NMOS region and the peri PMOS region.

An amorphous silicon layer 306 that is not doped with impurities may be formed on the tunnel insulation layer 302 and the gate insulation layer 304.

The amorphous silicon layer 306 may be coated with a first photoresist pattern 308 exposing a first portion of the amorphous silicon layer 306 in the peri NMOS region. Atoms having a larger size than that of silicon may be implanted into the first portion of the amorphous silicon layer 306 using the first photoresist pattern 308 as an ion implantation mask. Additionally, n-type impurities may be implanted into the first portion of the amorphous silicon layer 306 using the first photoresist pattern 308 as an ion implantation mask. As a result, a first amorphous silicon layer 306a may be formed in the peri NMOS region.

Figure 27:
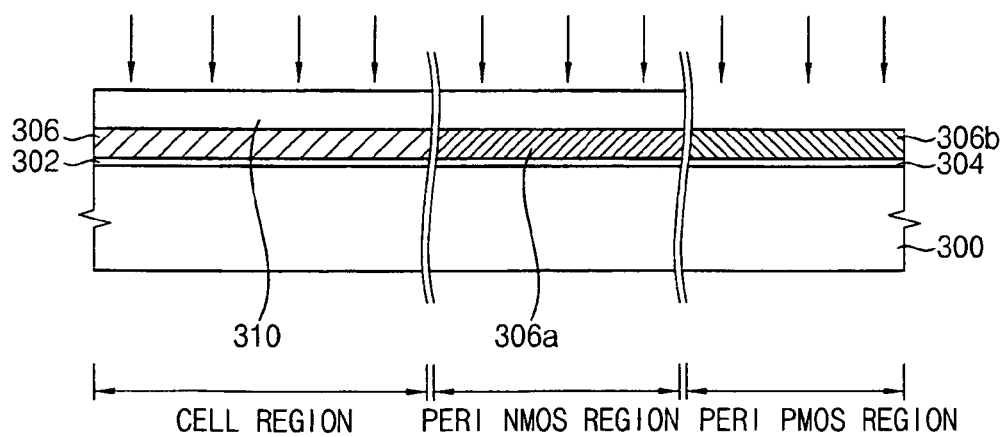

Referring to FIG. 27, the amorphous silicon layer 306 and the first amorphous silicon layer 306a may be coated with a second photoresist pattern 310 exposing a second portion of the amorphous silicon layer 306 in the peri PMOS region. Atoms having a smaller size than that of silicon may be implanted into the second portion of the amorphous silicon layer 306 using the second photoresist pattern 310 as an ion implantation mask. Additionally, p-type impurities may be implanted into the second portion of the amorphous silicon layer 306 using the second photoresist pattern 310 as an ion implantation mask. As a result, a second amorphous silicon layer 306b may be formed in the peri PMOS region.

The processes described above may be substantially the same as the processes described with reference to FIG. 22.

Figure 28:
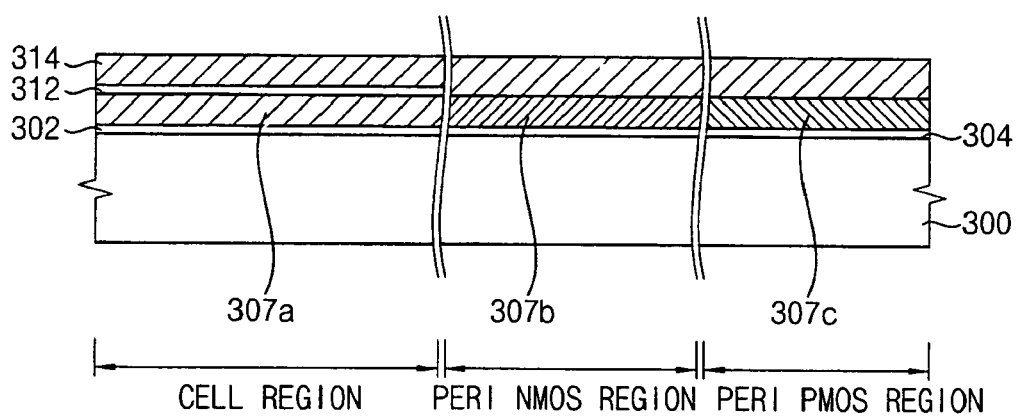

Referring to FIG. 28, the amorphous silicon layer 306 may be coated with a third photoresist pattern (not shown exposing a third portion of the amorphous silicon layer 306 in the cell region. N-type impurities may be implanted into the third portion of the amorphous silicon layer 306 using the third photoresist pattern as an ion implantation mask. As a result, a third amorphous silicon layer (not shown) may be formed in the cell region.

A heat treatment process may be performed on the first amorphous silicon layer 306a, the second amorphous silicon layer 306b and the third amorphous silicon layer, thereby activating the impurities therein. Thus, the first amorphous silicon layer 306a, the second amorphous silicon layer 306b and the third amorphous silicon layer may be transformed into a first polysilicon layer 307a, a second polysilicon layer 307b and a third polysilicon layer 307c, respectively.

A dielectric layer 312 may be formed on the first to third polysilicon layers 307a, 307b and 307c. Portions of the dielectric layer 312 on the second and third polysilicon layers 307b and 307c in the peri NMOS region and the peri PMOS region may be removed by a photolithography process to expose the second and third polysilicon layers 307b and 307c.

An upper amorphous silicon layer 314 that is not doped with impurities may be formed on the second and third polysilicon layers 307b and 307c and the dielectric layer 312.

Figure 29:
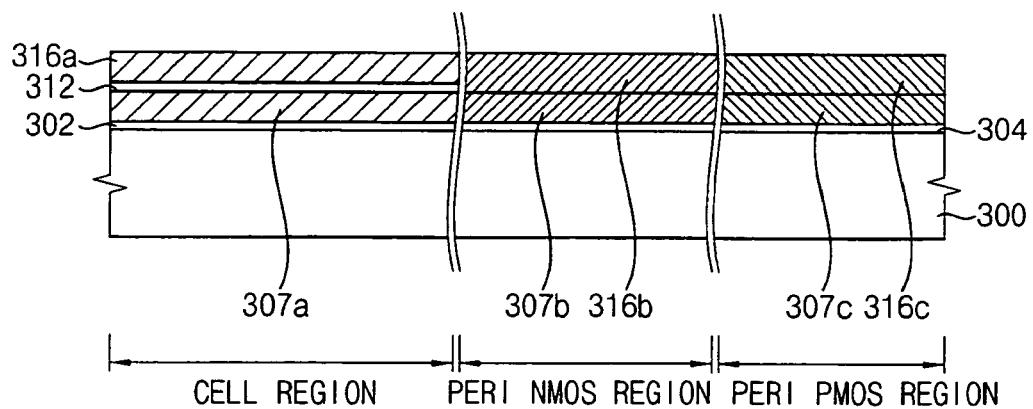

Referring to FIG. 29, ion implantation processes substantially the same as those described with reference to FIGS. 26, 27 and 23 may be performed on the upper amorphous polysilicon layer 314.

Particularly, as described with reference to FIG. 26, atoms having a larger size than that of silicon may be implanted into a first portion of the upper amorphous silicon layer 314 in the peri NMOS region. Additionally, n-type impurities may be implanted into the first portion of the upper amorphous silicon layer 314 in the peri NMOS region. As described with reference to FIG. 27, atoms having a smaller size than that of silicon may be implanted into a second portion of the upper amorphous silicon layer 314 in the peri PMOS region. Additionally, p-type impurities may be implanted into the second portion of the upper amorphous silicon layer 314 in the peri PMOS region. As described with reference to FIG. 23, n-type impurities may be implanted into a third portion of the upper amorphous silicon layer 314 in the cell region.

A heat treatment process may be performed on the upper amorphous silicon layer 314, thereby activating the impurities therein. Therefore, the upper amorphous silicon layers 314 may be changed to a polysilicon layer. Particularly, a fourth polysilicon layer 316a may be formed in the cell region, a fifth polysilicon layer 316b may be formed in the peri NMOS region and a sixth polysilicon layer 316c may be formed in the peri PMOS region.

Figure 30:
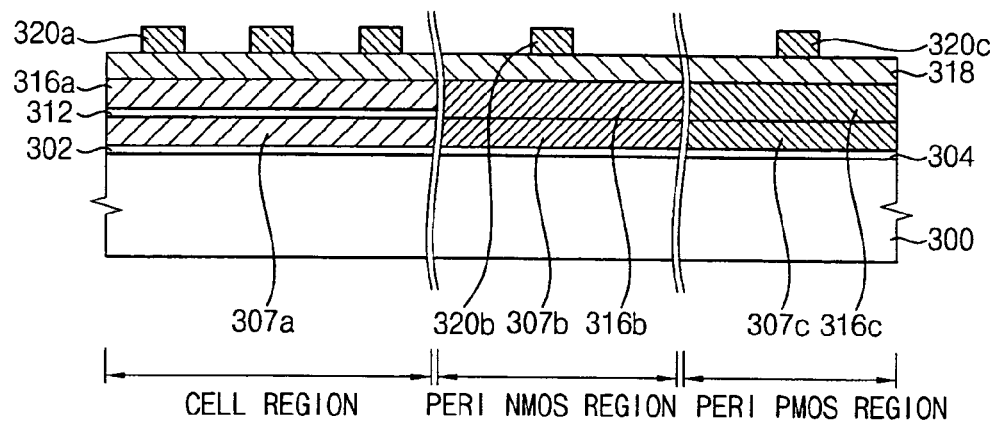

Referring to FIG. 30, a dielectric layer 318 may be formed on the fourth, fifth and sixth polysilicon layers 316a, 316b and 316c. A hard mask layer may be formed on the dielectric layer 318. The hard mask layer may be patterned to form a first, second and third hard masks 320a, 320b and 320c in the cell region, the peri NMOS region and the peri PMOS region, respectively.

Referring to FIG. 25 again, the conductive layer 318, the fourth, fifth and sixth polysilicon layers 316a, 316b and 316c, the dielectric layer 312, the gate insulation layer 304 and the tunnel insulation layer 302 may be patterned using the first, second and third hard masks serving as an etching mask.

Thus, a first gate structure, a second gate structure and a third gate structure may be formed on the substrate 300 in the cell region, the peri NMOS region and the peri PMOS region, respectively.

The first gate structure may include a tunnel insulation layer pattern 302a, a first polysilicon layer pattern 307d, a dielectric layer pattern 312a, a fourth polysilicon layer pattern 316d, a first conductive layer pattern 318a and a first hard mask 320a sequentially stacked on the substrate in the cell region. The first polysilicon layer pattern 307d may serve as a floating gate. The fourth polysilicon layer pattern 316d and the first conductive layer pattern 318a may serve as a control gate.

The second gate structure may include a second gate insulation layer pattern 304a, second and fifth polysilicon layer patterns 307e and 316e, a second conductive layer pattern 318b and a second hard mask 320b sequentially stacked on the substrate in the peri NMOS region.

The third gate structure may include a third gate insulation layer pattern 304b, a third and sixth polysilicon layer patterns 307f and 316f, a third conductive layer pattern 318c and a third hard mask 320c sequentially stacked on the substrate in the peri PMOS region.

Additionally, first to third impurity regions 322, 324 and 326 may be formed at first to third upper portions of the substrate 300 adjacent to the first to third gate structures, respectively. The first and second portions of the substrate 300 in the cell region and the peri NMOS region may be doped with n-type impurities, so that first and second impurity regions 322 and 324 may be formed, respectively. Additionally, the third portion of the substrate 300 in the peri PMOS region may be doped with p-type impurities, so that third impurity regions 326 may be formed.

As a result, the flash memory device may be manufactured. The flash memory device may include the cell transistor in the cell region, the NMOS transistor in the peri NMOS region and the PMOS transistor in the peri PMOS region.

Test of Operation Characteristics of a PMOS Transistor

Operation characteristics of a PMOS transistor of Examples 1 and 2 and Comparative Example were tested as follows.

In each Examples 1 and 2, a gate electrode was formed using polysilicon and doped with nitrogen, and a gate length was 0.063 μm. Doping concentrations of the nitrogen in the gate electrodes and ion implantation energies thereof in Examples 1 and 2 are shown in Table.

|  | Doping Concentrations Of Nitrogen | Ion Implantation Energy |
| --- | --- | --- |
| Example 1 | 9E14 at/cm$^2$ | 20 KeV |
| Example 2 | 1E15 at/cm$^2$ | 20 KeV |

In Comparative Example, a gate electrode was not doped with nitrogen with other conditions being the same as Examples 1 and 2.

Figure 31:
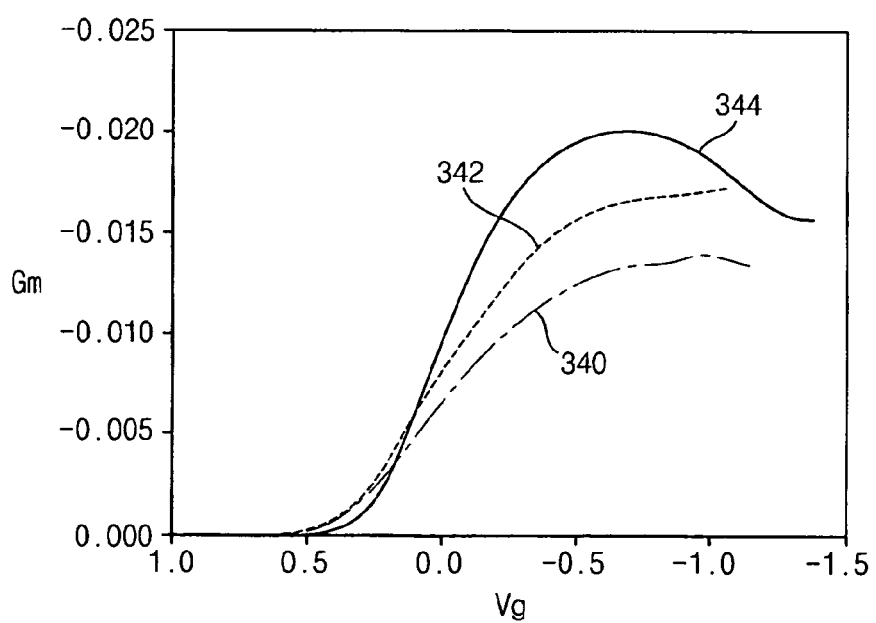

FIG. 31 is a graph showing transconductances (Gm) of Examples 1 and 2 and Comparative Example.

In FIG. 31, reference numeral 340 indicate the transconductance of Comparative Example 1, reference numeral 342 indicates the transconductance of Example 1, and reference numeral 344 indicates the transconductance of Example 2.

Referring to FIG. 31, as the concentration of nitrogen becomes higher, the transconductance becomes higher. When the concentration of nitrogen in the gate electrode becomes higher, the mobility of the carrier becomes higher and an ON current improves.

Figure 32:
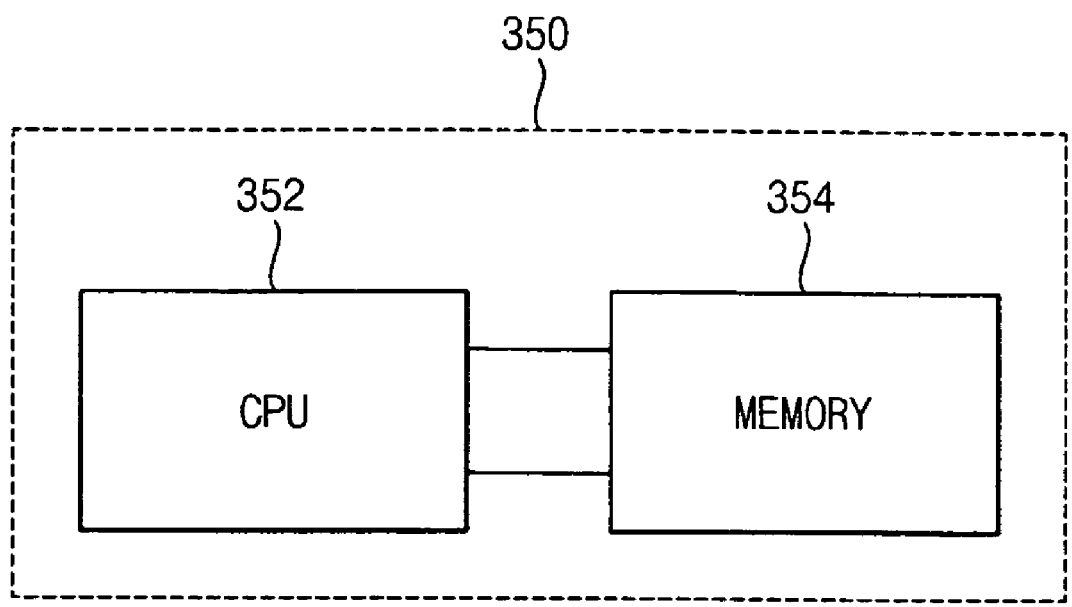

FIG. 32 is a block diagram illustrating a computer system including a gate structure in accordance with example embodiments.

Referring to FIG. 32, a computer system 350 may include a memory device 354 and a central processing unit (CPU) 352 electrically connected to the memory device 354. For example, the computer system 350 may include a personal computer or a personal data assistance. The memory device 354 may be connected with the CPU 352 directly or through a BUS.

According to example embodiments, polysilicon layers on or over a substrate, which may serve as gate electrodes of an NMOS transistor and a PMOS transistor, may include different elements for loading different stress on channel regions of the NMOS and PMOS transistors, respectively. Accordingly, the mobility of carriers of the transistors may be increased, and thus a semiconductor device including the NMOS and PMOS transistors may have improved operation characteristics.

Foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
a first gate structure including a first gate insulation layer pattern, a first polysilicon layer pattern, a first conductive layer pattern, and a first hard mask sequentially stacked on a substrate in a first region thereof, the first polysilicon layer pattern having atoms larger than silicon;
n-type impurity regions formed at first upper portions of the substrate adjacent to the first gate structure;
a second gate structure including a second gate insulation layer pattern, a second polysilicon layer pattern, and a second conductive layer pattern, and a second hard mask on the substrate in a second region thereof, the second polysilicon layer pattern having atoms smaller than silicon; and p-type impurity regions at second upper portions of the substrate on adjacent to the second gate structure, wherein the first conductive layer pattern includes a metal and is between the first polysilicon layer pattern and the first hard mask, and wherein the second conductive layer pattern includes a metal and is between the second polysilicon layer pattern and the second hard mask.

2. The semiconductor device of claim 1, wherein the substrate in the first region is under tensile stress and the substrate in the second region is under compress stress.

3. The semiconductor device of claim 1, wherein the first polysilicon layer pattern includes germanium, the second polysilicon layer pattern includes carbon.

4. A method of manufacturing a semiconductor device, the method comprising:

forming a gate insulation layer on a substrate including a first region and a second region;

forming a first polysilicon layer and a second polysilicon layer on the gate insulation layer, the first polysilicon layer including atoms larger than silicon and being on a first portion of the gate insulation layer in the first region, and the second polysilicon layer including atoms smaller than silicon and being on a second portion of the gate insulation layer in the second region;

forming a first and second conductive layer on the first and second polysilicon layer, respectively;

forming a first hard mask and a second hard mask on the first and second conductive layers, respectively;

patterning the first and second conductive layer, the first and second polysilicon layers, and the first and second portions of the gate insulation layer to form first and second gate electrodes and first and second gate insulation layer patterns, respectively;

forming n-type impurity regions by implanting n-type impurities at first upper portions of the substrate adjacent to the first gate electrode; and forming p-type impurity regions by implanting p-type impurities at second upper portions of the substrate adjacent to the second gate electrode, wherein the first conductive layer pattern includes a metal and is between the first polysilicon layer pattern and the first hard mask, and wherein the second conductive layer pattern includes a metal and is between the second polysilicon layer pattern and the second hard mask.

5. The method of claim 4, further comprising forming a conductive layer including a metal on the first and second polysilicon layers.

6. The method of claim 4, wherein forming the first and second polysilicon layers includes:

forming an amorphous silicon layer on the gate insulation layer;

implanting atoms having a larger size than that of silicon into a first portion of the amorphous silicon layer in the first region;

implanting atoms having a smaller size than that of silicon into a second portion of the amorphous silicon layer in the second region; and crystallizing the amorphous silicon layer by a heat treatment process thereon to form the first and second polysilicon layers.

7. The method of claim 4, further comprising doping n-type impurities and p-type impurities into the first and second portions of the amorphous silicon layer, respectively.

8. The method of claim 4, wherein the first polysilicon layer pattern includes germanium and the second polysilicon layer pattern includes carbon.

9. The method of claim 8, wherein the first polysilicon layer pattern includes germanium in a range of about 1% to about 30% by atomic percent.

10. The method of claim 8, wherein the second polysilicon layer pattern includes carbon in a range of about 0.1% to about 5% by atomic percent.

* * * * *